United States Patent

Yoshizawa et al.

[11] Patent Number: 5,967,804
[45] Date of Patent: *Oct. 19, 1999

[54] CIRCUIT MEMBER AND ELECTRIC CIRCUIT DEVICE WITH THE CONNECTING MEMBER

[75] Inventors: Tetsuo Yoshizawa, Yokohama; Hideyuki Nishida, Kawasaki; Masaaki Imaizumi, Tokyo; Yasuteru Ichida, Machida; Masaki Konishi, Ebina; Hiroshi Kondo, Yokohama; Takashi Sakaki, Tokyo, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/597,383

[22] Filed: Feb. 8, 1996

Related U.S. Application Data

[63] Continuation of application No. 08/336,090, Nov. 7, 1994, abandoned, which is a continuation of application No. 08/072,862, Jun. 7, 1993, abandoned, which is a continuation of application No. 07/819,673, Jan. 13, 1992, abandoned, which is a continuation of application No. 07/553,366, Jul. 17, 1990, abandoned, which is a continuation of application No. 07/164,205, Mar. 4, 1988, abandoned.

[30] Foreign Application Priority Data

| Mar. 4, 1987 | [JP] | Japan | 62-49584 |
| Mar. 5, 1987 | [JP] | Japan | 62-50936 |
| Mar. 18, 1987 | [JP] | Japan | 62-63497 |
| Mar. 18, 1987 | [JP] | Japan | 62-63498 |
| Mar. 19, 1987 | [JP] | Japan | 62-65208 |
| Mar. 19, 1987 | [JP] | Japan | 62-65209 |
| Mar. 20, 1987 | [JP] | Japan | 62-66484 |
| Mar. 20, 1987 | [JP] | Japan | 62-66485 |
| Mar. 26, 1987 | [JP] | Japan | 62-71977 |
| Mar. 26, 1987 | [JP] | Japan | 62-71978 |
| Mar. 26, 1987 | [JP] | Japan | 62-71979 |
| Mar. 31, 1987 | [JP] | Japan | 62-79007 |
| Mar. 31, 1987 | [JP] | Japan | 62-79008 |
| Mar. 31, 1987 | [JP] | Japan | 62-79009 |
| Apr. 2, 1987 | [JP] | Japan | 62-82037 |
| Apr. 2, 1987 | [JP] | Japan | 62-82038 |
| Apr. 2, 1987 | [JP] | Japan | 62-82039 |
| Feb. 22, 1988 | [JP] | Japan | 63-38860 |
| Feb. 22, 1988 | [JP] | Japan | 63-38861 |
| Feb. 22, 1988 | [JP] | Japan | 63-38862 |
| Feb. 22, 1988 | [JP] | Japan | 63-38863 |
| Feb. 22, 1988 | [JP] | Japan | 63-38864 |
| Feb. 22, 1988 | [JP] | Japan | 63-38865 |

[51] Int. Cl.[6] ................................. H01R 9/09
[52] U.S. Cl. ........................................... 439/91
[58] Field of Search ................. 439/66–75, 86, 439/91, 591; 361/405, 406, 408, 413, 414, 792–795; 228/180.1, 249; 357/69, 70; 174/52.4; 29/877, 883, 843, 830; 257/686

[56] References Cited

U.S. PATENT DOCUMENTS

| 2,896,135 | 7/1959 | Briggs | 524/440 |
| 3,107,414 | 10/1963 | Sterling | 361/795 |
| 3,184,831 | 5/1965 | Siebertz | 228/115 |
| 3,296,099 | 1/1967 | Dinella | 174/255 |
| 3,320,658 | 5/1967 | Bolda et al. | 228/180.2 |
| 3,324,445 | 6/1967 | Miller | 439/66 |
| 3,541,222 | 11/1970 | Parks et al. | 439/66 |
| 3,662,230 | 5/1972 | Redwantz | 439/68 |
| 3,668,755 | 6/1972 | Larsen | 228/193 |
| 3,787,958 | 1/1974 | Freedman | 228/193 |
| 3,835,531 | 9/1974 | Luttmer | 228/187 |
| 3,904,934 | 9/1975 | Martin | 439/74 |
| 3,923,231 | 12/1975 | Catalano | 228/193 |
| 4,000,842 | 1/1977 | Burns | 228/180.2 |
| 4,003,621 | 1/1977 | Lamp | 439/91 |
| 4,074,342 | 2/1978 | Honn et al. | 361/411 |
| 4,157,932 | 6/1979 | Hirata | 29/885 |
| 4,209,481 | 6/1980 | Kashiro et al. | 439/91 |
| 4,230,901 | 10/1980 | Wengler et al. | 29/841 |
| 4,240,198 | 12/1980 | Alonso | 439/91 |
| 4,249,302 | 2/1981 | Crepeau | 29/830 |
| 4,251,852 | 2/1981 | Ecker et al. | 361/386 |
| 4,252,990 | 2/1981 | Sado | 439/86 |
| 4,420,767 | 12/1983 | Hodge et al. | 439/71 |
| 4,449,774 | 5/1984 | Takashi et al. | 439/91 |
| 4,494,688 | 1/1985 | Hatada et al. | 228/180.2 |
| 4,498,122 | 2/1985 | Rainal | 361/414 |
| 4,539,622 | 9/1985 | Akasaki | 361/792 |

| 4,672,152 | 6/1987 | Shinohora et al. | 361/792 |
| 4,699,831 | 10/1987 | Hartmann et al. | 206/328 |
| 4,705,205 | 11/1987 | Allen et al. | 439/876 |
| 4,754,546 | 7/1988 | Lee et al. | 29/877 |
| 4,761,388 | 8/1988 | Oguri et al. | 264/DIG. 19 |
| 4,793,814 | 12/1988 | Zifcak et al. | 439/91 |
| 4,874,721 | 10/1989 | Kimura et al. | 29/830 |
| 4,897,918 | 2/1990 | Osaka et al. | 29/830 |

FOREIGN PATENT DOCUMENTS

| 0178170 | 4/1986 | European Pat. Off. . | |
| 0196865 | 10/1986 | European Pat. Off. . | |
| 0260490 | 3/1988 | European Pat. Off. . | |
| 53-62570 | 6/1978 | Japan | 439/71 |

OTHER PUBLICATIONS

IBM Technical Disclosure, Fedrowitz, vol. 20, No. 12, p. 5172, May 1978.

IBM Technical Disclosure, Johnson, vol. 21, No. 6, p. 2320, Nov. 1978.

IBM Bulletin, Cameron, vol. 11, No. 8, p. 971, Jan. 1969, copy in 29/841.

Owczarski, Diffusion Welding, SAE Transactions (1965), 73., pp. 537–548.

*Primary Examiner*—Neil Abrams
*Attorney, Agent, or Firm*—Fitzpatrick, Cella, Harper & Scinto

[57] ABSTRACT

An electrical connecting member for use in an electrical connection for connecting a first electrical circuit component on a side thereof and a second electrical circuit component on another side thereof, said electrical connecting member comprising: a plurality of layers each layer having a plurality of conductive members and an insulative holder for holding said plurality of conductive members, wherein said plurality of conductive members are arranged such that each conductive member has one end exposed on one surface of said layer and another end exposed on another surface of said layer, and makes electric contact with at least one of a conductive member immediately below and a conductive member immediately above, but does not contact conductive members laterally offset thereof, and wherein said conductive members have diameters that are substantially equal to each other, between said one surface of said layer and said another surface of said layer; and said plurality of layers are stacked such that said plurality of conductive members in one layer are connected with said plurality of conductive members in another layer, and are held by said insulative holder with a different pitch shifted slightly from said plurality of conductive members in another layer. It is a further object to provide an electrical member and an electrical circuit device which employ such an electrical connecting member.

9 Claims, 19 Drawing Sheets

CIRCUIT MEMBER AND ELECTRIC CIRCUIT DEVICE WITH THE CONNECTING MEMBER

This application is a continuation of application Ser. No. 08/336,090 filed Nov. 7, 1994, now abandoned which is a continuation of application Ser. No. 08/072,862 filed Jun. 7, 1993, now abandoned, which is a continuation of application Ser. No. 07/819,673, filed Jan. 13, 1992, now abandoned, which is a continuation of application Ser. No. 07/553,366 filed Jul. 17, 1990, now abandoned, which is a continuation of application Ser. No. 07/164,205 filed Mar. 4, 1988, now abandoned.

BACKGROUND OF THE INVENTION

1. Field of the Invention

The present invention relates to an electrical connecting member for electrically connecting electric circuit parts, and to an electric circuit member and an electric circuit device using the connecting member.

2. Related Background Art

Hitherto, various methods have been known for constructing an electrical circuit member by electrically connecting a plurality of electric circuit components. These methods are exemplarily shown below.

(1) Wire bonding method

FIGS. 1 and 2 show a typical example of a semiconductor device having components connected and sealed by the wire bonding method. The wire bonding method will be explained hereinunder with reference to FIGS. 1 and 2.

According to the wire bonding method, a semiconductor element 4 is fixed to and supported by an element mounting portion 2 by means of, for example, an Ag paste 3. Subsequently, the bonding portions 5 of the semiconductor element 4 and the desired connecting portions 6 of a lead frame 1 are bonded through ultra-fine metallic wires 7 such as gold wires.

After the connection is completed, the semiconductor element 4 and the lead frame 1 are sealed by means of a resin 8 and, thereafter, the unnecessary portion of the lead frame 1 extending outward from the sealing resin is cut and bent, whereby a semiconductor device 9 is obtained.

(2) TAB (Tape Automated Bonding) Method (see, for example, Japanese Patent Unexamined Publication No. 59-139636)

FIG. 3 shows a typical example of a semiconductor device having elements connected and sealed by the TAB method. Briefly, this method is an automatic bonding method making use of a tape carrier system. Referring to FIG. 3, after the carrier film substrate 16 and a semiconductor element 4 are located, the inner lead portion 17 of the carrier film substrate 16 and the connecting portion 5 of the semiconductor element 4 are heat-bonded. Thereafter, the inner lead 17 and the semiconductor element 4 are sealed by resins 20 and 21.

(3) CCB (Controlled Collapse Bonding) Method (see, for example, Japanese Patent Examined Publication No. 42-2096 and Japanese Patent Unexamined Publication No. 60-57944)

FIG. 4 shows a typical example of a semiconductor device having elements connected and sealed by the CCB method. This method, which also is referred to as the flip chip bonding method, will be explained with reference to FIG. 4. A semiconductor element 4, which is beforehand provided with solder bumps 31, is located and placed on a circuit board 32. Thereafter, the solder is heated and molten so that the semiconductor element 4 is connected to the circuit board 32. Then, after washing away the flux, the semiconductor element 4 is sealed so that a semiconductor device 9 is obtained.

(4) Method Illustrated in FIGS. 5 and 6

An insulating film 71 of, for example, polyimide is formed on the portion of a first semiconductor element 4 other than the connecting portion 5, while a metallic member 70 such as Au is placed on the connecting portion 5. Then, the exposed surfaces 73, 72 of the metallic member 70 and the insulating film 71 are flattened. Similarly, an insulating film 71' of, for example, polyimide is formed on the portion of a second semiconductor element 4' other than the connecting portion 5', while a metallic member 70' such as Au is placed on the connecting portion 5. Then, the exposed surfaces 73', 72' of the metallic member 70' and the insulating film 71' are flattened. Thereafter, the first semiconductor device 4 and the second semiconductor device 4' are located with respect to each other as shown in FIG. 6 and heat and pressure are applied to both semiconductor devices, whereby the connecting portions 5 and 5' of the first and second semiconductor elements 4 and 4' are connected to each other through the metallic members 70, 70'.

(5) Method Illustrated in FIG. 7

A first circuit board 75 and a second circuit board 75' are located with respect to each other through the intermediary of an anisotropic conductive film 78 having conductive particles dispersed in an insulating material 77. Then, pressure or pressure and heat are applied to the first and second circuit boards, whereby both circuit boards are connected at their connecting portions 76 and 76.'

(6) Method illustrated in FIG. 8

A first circuit board 75 and a second circuit board 75' are located with respect to each other through the intermediary of an elastic connector 83 composed of an insulating material 81 and metallic wires of Fe, Cu or the like unidirectionally disposed in the insulating material 81. Then, pressure is applied to both circuit boards, whereby both circuit boards are connected at their connecting portions 76, 76'.

These known bonding methods, however, suffer from the following drawbacks.

(1) Drawbacks of wire bonding method (a) When the design is such that the connecting portion 5 of the semiconductor element 4 is within the area of the semiconductor element 4, the ultra-fine metallic wires 7, due to their extremely small diameters, tend to contact the outer peripheral portion 10 of the semiconductor element 4 or the outer peripheral region 11 of the element mounting portion 2. Such contact of the ultra-fine metallic wire 7 with the outer peripheral regions 10 and 11 causes a short-circuiting. Such a design also requires that the ultra-fine metallic wire 7 has an increased length, which in turn increases the risk for the ultra-fine wires 7 to be deformed during the transfer molding.

In order to obviate these problems, the connecting portions 5 have to be disposed on the restricted areas along the peripheral sides of the semiconductor element 4, with the result that the freedom in the circuit design is impaired.

(b) In forming a device by the wire bonding method, it is necessary that the pitch of the connecting portions 5 on the semiconductor element 4 in terms of the distance between the centers of the adjacent connecting portions must be greater than a predetermined value, in order to eliminate any possibility of interference between adjacent ultra-fine metallic wires 7. This means that the maximum number of the connecting portions 5 is essentially determined by the size of the semiconductor element 4. According to the wire bonding method, therefore, the above-mentioned pitch is as large as about 0.2 mm, so that the number of the connecting portions 5 is undesirably limited.

(c) The height h of the ridge of the ultra-fine metallic wire 7 as measured from the connecting portion 5 of the semiconductor element 4 is usually from 0.2 to 0.4 mm. It is rather difficult to reduce this height to a value below 0.2 mm. Thus, the reduction of the thickness of the whole device is difficult to achieve.

(d) Wire bonding is generally time-consuming. Thus, an impractically long time is required particularly when the number of connecting points is large, resulting in a reduction in the production efficiency.

(e) The ultra-fine metallic wire 7 tends to be deformed or, in the worst case, broken when the transfer molding condition is exceeded for any reason.

(f) At each connecting portion 5 on the semiconductor element 4 is exposed A$\ell$ which is not alloyed with the ultra-fine metallic wire 7. This increases the tendency for A to be corroded, with the result that the reliability is impaired.

(2) Drawbacks of the TAB Method (a) If the design is such that the connecting portion 5 of the semiconductor element 4 is within the area of the semiconductor element 4, the length $\ell$ of the inner lead 17 of the carrier film board 16 is increased so that the inner lead 17 becomes liable to deform, with the result that the connection of the inner lead 17 to the desired connecting portion 5 is broken or the inner lead 17 contacts a portion of the semiconductor element 4 other than the connecting portion 5. In order to obviate this problem, it is necessary that the connecting portion 5 of the semiconductor element 4 is positioned on a peripheral portion of the semiconductor element 4, which undesirably restricts the freedom in design.

(b) The pitch of the connecting portions on the semiconductor element 4 has to be as large as 0.09 to 0.15 mm also in the case of the B method. Therefore, it is difficult to increase the number of connecting portions, as in the case of the wire bonding method as explained in (2)(b) above.

(c) In order to prevent the inner lead portion 17 of the carrier film board 16 from contacting any portion of the semiconductor element 4 other than the connecting portion, the inner lead 17 is strictly required to have a predetermined connecting form, resulting in an increased production cost.

(d) In order to connect the connecting portions 5 of the semiconductor element 4 and the inner leads 17, it is necessary that gold bumps be provided either on the connecting portions 5 of the semiconductor element or on the inner lead 17, so that the cost is raised uneconomically.

(3) Drawbacks of CCB Method (a) Cost is raised due to the necessity of forming solder bumps 31 on the connecting portions 5 of the semiconductor element 4. A too large amount of the solder bump causes bridging between adjacent solder bumps, while a too small amount of solder bump may cause insufficient electrical connection between the connecting portion 5 of the semiconductor element 4 and the connecting portion 33 of the board 32, thus impairing the reliability of the electrical connection. In addition, the reliability of the electrical connection is influenced by the amount and shape of the solder bump. In this regard, reference is made to Technical Report of Brazing Technic Association No. 017-'84, issued from Brazing Technic Association. The fact that the amount of the solder bump affects the reliability of the electrical connection means that the amount of the solder bump has to be delicately controlled.

(c) When the solder bumps 31 are located within the area of the semiconductor element 4, it is very difficult to visually check whether the connection has been achieved in good manner.

(d) The semiconductor element exhibits inferior heat radiation characteristics. In this regard, a reference may be made to Electronic Packaging Technology 1987, 1 (Vol. 3, No. 1) p. 66–71, NIKKEI MICRODEVICES, May 1986, pp. 97–108. Various measures have to be taken for the purpose of improving the heat radiation characteristic of the product.

(4) Drawbacks of Method Illustrated in FIGS. 5 and 6

(a) The number of steps of production process is increased and the production cost is raised correspondingly due to the necessity for flattening the exposed surface 72 of the insulating film 71 and the exposed surface 73 of the metallic member 70, as well as the exposed surface 72' of the insulating film 71' and the exposed surface 73' of the metallic member 70'.

(b) The state of connection between the metallic members 70 and 70' is impaired if there is any irregularity or unevenness in the exposed surface 72 of the insulating film 71 and the exposed surface 73 of the metallic member 70, or the exposed surface 72' of the insulating film 71' and the exposed surface 73' of the metallic member 70'. In consequence, the reliability of the electrical connection is reduced.

(5) Drawbacks of Method Illustrated in FIG. 7

(a) Bonding is achieved by applying pressure to the bonding portions 76, 76' after locating two members. It is very difficult to apply this pressure uniformly on all the bonding portions. In consequence, the states of connection fluctuate greatly, with the result that the value of contact resistance also fluctuates greatly. Consequently, the reliability of the electrical connection is impaired. In addition, this bonding method is not suited to the production of devices which requires electric current to be supplied at a large rate, because the supply of such a large electric current inevitably causes a large heat generation.

(b) The fluctuation of the resistance value is inevitable due to the orientation of the conductive particles 79 of the anisotropic conductive film 78, even when the pressure is uniformalized. In consequence, the reliability of the connection is impaired, and the product produced by this bonding method cannot have a large electric current capacity.

(c) The value of the resistance between adjacent bonding portions is reduced when the pitch of the bonding portions is decreased. Thus, this bonding method is not suited to a high connecting density.

(d) The resistance value varies depending on the amount of fluctuation of the projection height $h_1$ of the bonding portions 76, 76' of the circuit boards 75, 75'. It is therefore necessary to accurately control the amount of fluctuation of the projection height $h_1$.

(e) When the anisotropic conductive film is used for the purpose of bonding between a semiconductor element and a circuit board or between a first semiconductor element and a second semiconductor element, a problem is encountered in that the cost is raised due to the necessity of provision of bumps on the bonding portions of the semiconductor devices, in addition to the drawbacks (a) to (d) mentioned above.

(6) Drawbacks of Method Illustrated in FIG. 8

(a) A specific pressing jig is required for applying the bonding pressure.

(b) The electric resistance across the points of contact between the metallic wire 82 of the elastic connector 83 and the bonding portion 76 of the first circuit board 75, as well as between the metallic wire 82 of the elastic connector 83 and the bonding portion 76' of the first circuit board 75', varies depending on the pressure applied and the states of the contact surfaces. Thus, the reliability of the connection is not so high.

(c) The metallic wires 82 of the elastic connector 83 are rigid. When the pressing force is large, therefore, the risk is increased for the surfaces of the first and the second circuit boards 75 and 75' to be broken. On the other hand, a too small pressing force impairs the reliability of the connection.

(d) The values of electric resistance at the contact portions, as well as the tendency for the mechanical breakdown, are largely affected by fluctuation in the amount $h_2$ of projections of the bonding portions 76, 76' of the circuit boards 75, 75', as well as by fluctuation in the amount $h_3$ of projection of the metallic wire 82 of the elastic connector 83. It is therefore necessary to take a suitable countermeasure for eliminating such fluctuation in the projection amounts.

(e) Drawbacks similar to (a) to (d) above are encountered also when the elastic connector is used for the bonding between a semiconductor element and a circuit board or for the bonding between a first semiconductor element and a second semiconductor element.

SUMMARY OF THE INVENTION

It is an object of the present invention to solve the above-mentioned problems and to provide a low cost electrical connecting member with high density and high reliability, and electric circuit member and an electric circuit device using the connecting member.

The present invention may provide highly concentrated multiple connections and improvement in various properties such as a thermal property, as well as replace conventional connecting methods.

It is another object to provide an electrical connecting member for use in an electrical connection for connecting a first electrical circuit component on a side thereof and a second electrical circuit component on another side thereof, said electrical connecting member comprising: a plurality of layers each layer having a plurality of conductive members and an insulative holder for holding said plurality of conductive members, wherein said plurality of conductive members are arranged such that each conductive member has one end exposed on one surface of said layer and another end exposed on another surface of said layer, and makes electric contact with at least one of a conductive member immediately below and a conductive member immediately above, but does not contact conductive members laterally offset thereof, and wherein said conductive members have diameters that are substantially equal to each other, between said one surface of said layer and said another surface of said layer; and said plurality of layers are stacked such that said plurality of conductive members in one layer are connected with said plurality of conductive members in another layer, and are held by said insulative holder with a different pitch shifted slightly from said plurality of conductive members in another layer. It is a further object to provide an electrical member and an electrical circuit device which employ such an electrical connecting member.

BRIEF DESCRIPTION OF THE DRAWINGS

FIGS. 1 and 3–8 are cross-sectional views and FIG. 2 is a perspective plan view.

FIG. 9A shows a state before connection and FIG. 9B shows a state after connection.

FIG. 10A is an oblique view and FIG. 10B is a cross-sectional view.

FIG. 11A is a cross-sectional view, FIG. 11B is an oblique view, and FIG. 11C also is a cross-sectional view.

FIGS. 12A and 12C are cross-sectional views and FIG. 12B is an oblique view.

FIGS. 13A and 14A are oblique views thereof and FIGS. 13B and 14B are cross-sectional views.

FIG. 15A is an oblique view and FIG. 15B is a cross-sectional view.

FIG. 16A is a cross-sectional view, FIG. 16B is an oblique view, and FIG. 16C also is a cross-sectional view.

FIGS. 17A and 17C are cross-sectional views and FIG. 17B is an oblique view.

FIGS. 18A and 19A are oblique views and FIGS. 18B and 19B are cross-sectional views.

FIG. 20A is an oblique view and FIG. 20B is a cross-sectional view.

FIG. 21A is a cross-sectional view, FIG. 21B is an oblique view, and FIG. 21C also is a cross-sectional view.

FIGS. 22A and 22C are cross-sectional views and FIG. 22B is an oblique view.

FIGS. 23A and 24A are oblique views and FIGS. 23B and 24B are cross-sectional views.

FIG. 25A is an oblique view and FIG. 25B is a cross-sectional view.

FIG. 26A is a cross-sectional view, FIG. 26B is an oblique view, and FIG. 26C also is a cross-sectional view.

FIGS. 27A and 27C are cross-sectional views and FIG. 27B is an oblique view.

FIGS. 28A and 29A are oblique views and FIGS. 28B and 29B are cross-sectional views.

DESCRIPTION OF THE PREFERRED EMBODIMENTS

Figure 1:
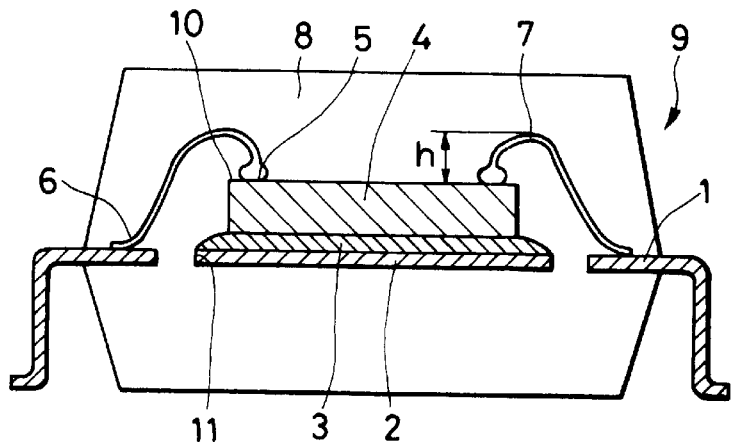
FIGS. 1 to 8 show examples of conventional techniques.
Figure 2:
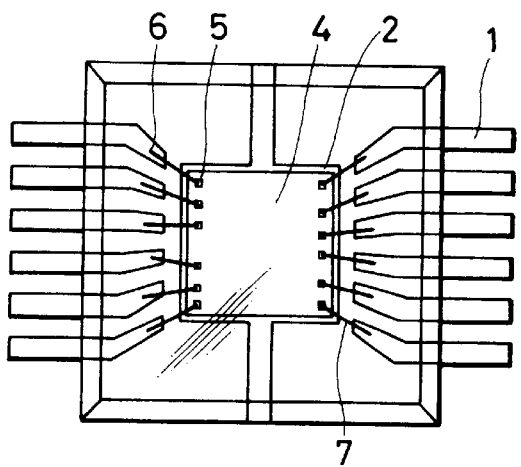
Figure 3:
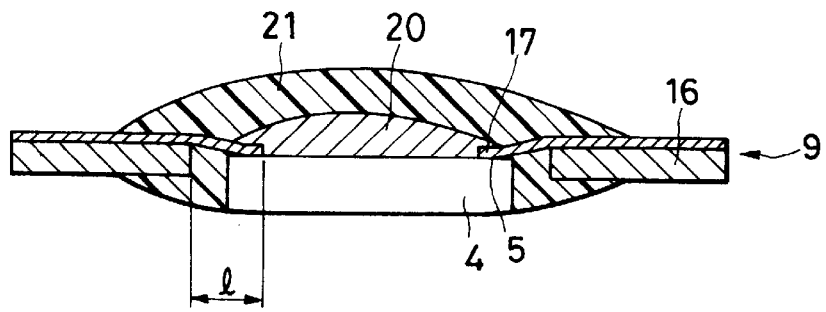
Figure 4:
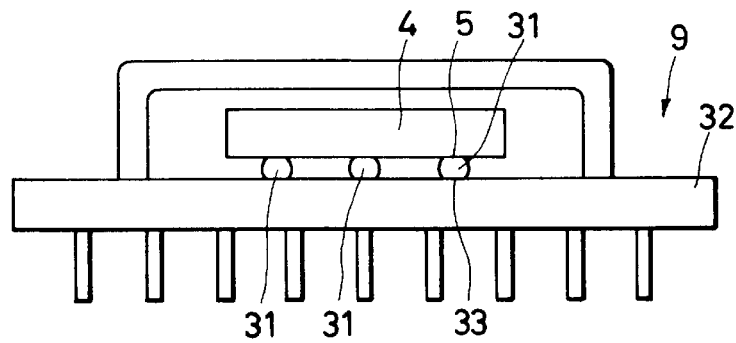
Figure 5:
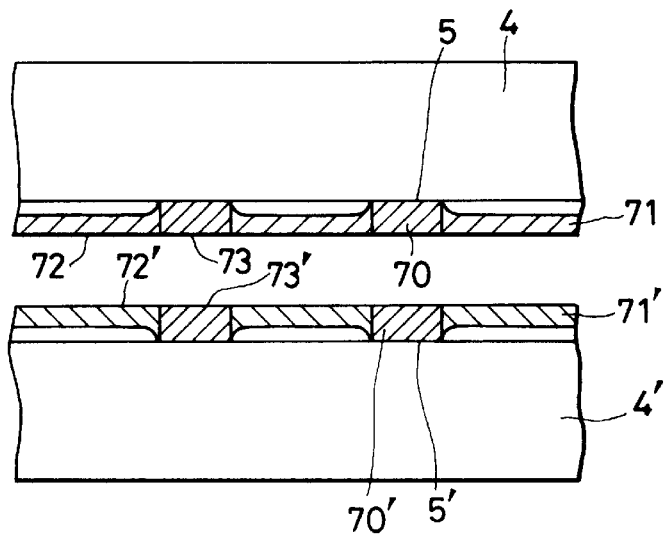
Figure 6:
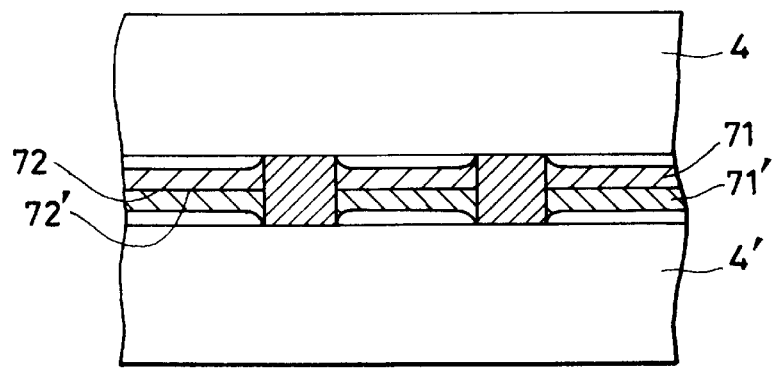
Figure 7:
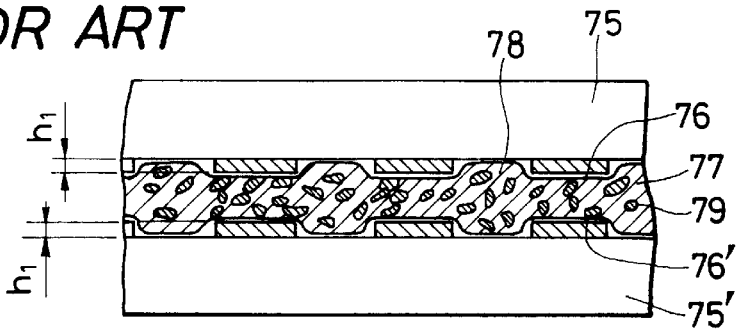
Figure 8:
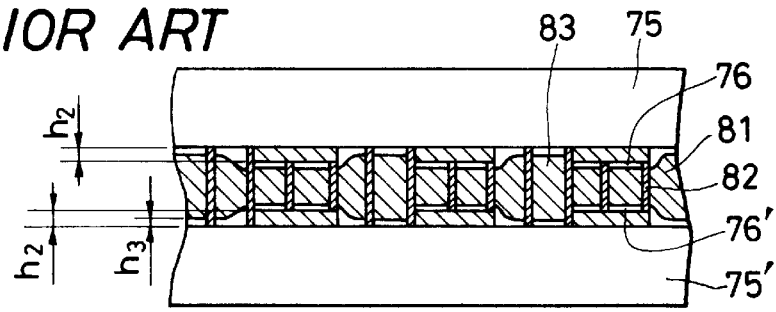

According to the present invention, a first electric circuit component and a second electric circuit component are connected to each other through an electrical connecting member or electrical bonding intermediary.

Basically, the present invention provides an electric circuit device composed of a first electric circuit component provided with bonding portions, a second electric circuit component having bonding areas, and an electrical connecting member or electric bonding intermediary placed and connected between the first and second electric circuit components so as to attain electrical connection between the first and second electric circuit components at their bonding areas. The electrical connecting member or electric bonding intermediary includes a plurality of conductive members embedded in a holding member in such a manner that they are electrically insulated from one another, with one end of each conductive member exposed in a first surface of the holding member facing the first electric circuit component while the other end of each conductive member is exposed in a second surface of the holding member facing the second electric circuit component. The ends of the conductive members exposed in the same side as the first electric circuit component are connected to the bonding areas of the first electric circuit component, while the ends of the conductive members exposed in the same side as the second electric circuit component are connected to the bonding areas of the second electric circuit component.

The elementary electric bonding intermediary has a single-layered structure, while the electrical connecting member of the present invention has a structure composed of two or more layers.

Electric Circuit Components Usable in Invention

Examples of the electric circuit components suitably used in the invention are semiconductor devices or elements, circuit boards such as plastic circuit boards, ceramic circuit boards, and metallic circuit boards, and lead frames. Thus, the electric circuit device of the present invention is composed of a first electric circuit component which may be any one of the above-mentioned devices or circuit boards and a second electric circuit component which also may be any oneof the above-mentioned devices or circuit boards.

It should be noted that one or more electrical circuit components to be connected to the electrical bonding intermediary may be provided on one of the surfaces of the holding member.

Thus, any type of electric parts having bonding areas are usable as the electric circuit component in the present invention, regardless of the number of the bonding areas, though the advantage brought about by the invention becomes more appreciable as the number of bonding areas is increased. It is also to be understood that there is no restriction in the positions of the bonding areas. It is to be noted, however, that the advantage of the present invention becomes more remarkable when the bonding areas are located in the inner portion of the electric circuit component.

Figure 9A:
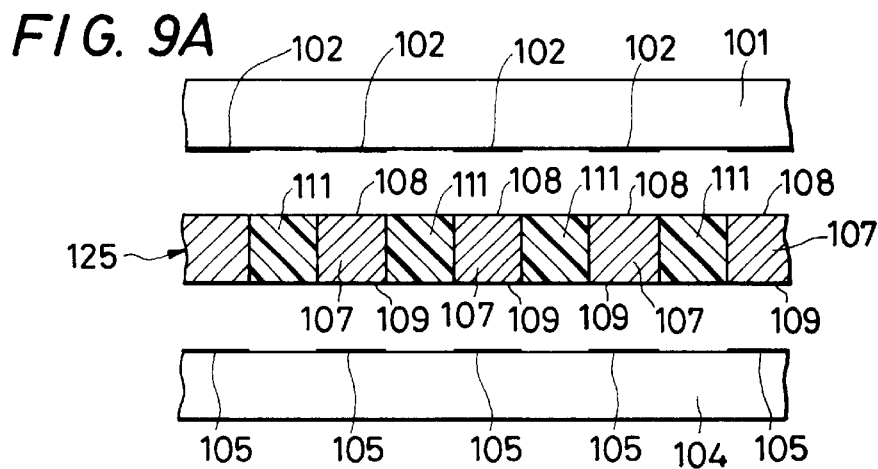
FIGS. 9A and 9B show an embodiment of the invention.
Figure 9B:
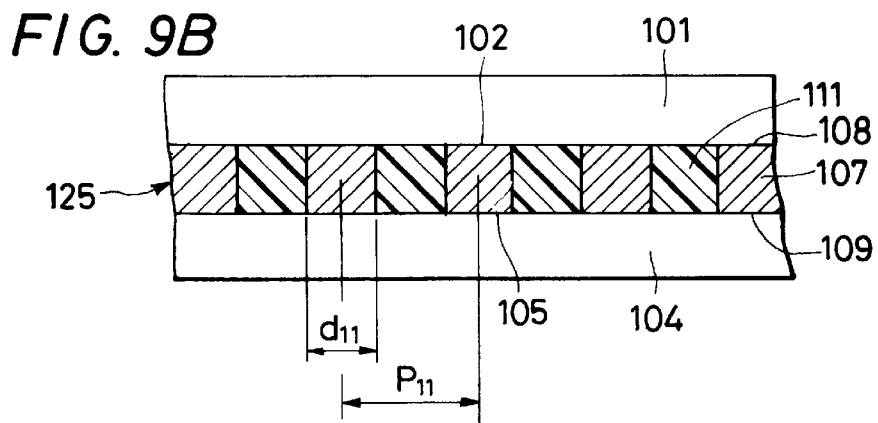

A typical electric circuit device of the present invention will be described hereunder with reference to FIGS. 9A and 9B. The circuit device includes a circuit board 101 as a first electric circuit component with bonding areas 102, a second circuit board 104 as a second electric circuit component with bonding areas 105, and an electrical connecting member or electric bonding intermediary 125 of the present invention placed between both circuit boards 101, 104 and connected to the bonding areas 102, 105, thereby providing electrical connection between the first and the second circuit boards. The connecting member or bonding intermediary 125 includes an insulator 111 and a plurality of metallic members 107 of a metal or an alloy embedded in the insulator 111 in such a manner that the metallic members 107 are electrically insulated from one another and that one end of each of the metallic members 107 is exposed on one side of the insulator adjacent to the first circuit board 101 while the other end of each of the metallic members 107 is exposed on the other side of the insulator 111 adjacent to the second circuit board 104.

The bonding areas 102 of the first circuit board 101 are exposed at positions corresponding to the bonding areas 105 of the second circuit board 104 and the bonding areas 108, 109 of the electrical connecting member or electric bonding intermediary 125.

Conductive Member in Electric Bonding Intermediary Used in Invention

The conductive member according to the invention includes, for example, metallic material. Gold is used most suitably as the material of the metallic members of the electrical connecting member or electric bonding intermediary used in the present invention, but other metals or alloys can also be used satisfactorily, such as Ag, Be, Ca, Mg, Mo, Ni, W, Fe, Ti, In, Ta, Zn, Cu, Al, Sn, Pb-Sn, and so forth.

Additionally, with regard to the metallic member, the same metals or different metals may be present in the same electrical connecting member or electrical bonding intermediary. One of the metallic members may be formed by the same metals or alloys or different metals or alloys. Further, the material in which the organic and/or inorganic material is included in the metal may be used as a metallic member if it has electrical conductivity. Still further, the conductive material combined with organic and inorganic materials may also be used. It is to be noted that super conductive materials may be used as the conductive member.

The metallic member can have any desired cross-sectional shape such as circular, square or any other shape.

The diameter or size of the metallic member also can be selected freely. For instance, the diameter is determined to be not smaller than 20 $\mu$m, taking into account the pitch of the bonding areas on the electric circuit components, though it may be determined to be not greater than 20 $\mu$m.

The exposed portion of the metallic member may be flush with the insulating holder or may be projected therefrom. The arrangement may be such that the metallic members project only at one side of the holder or at both sides thereof. The projected ends of the metallic members may be shaped in the form of bumps.

The pitch of the metallic members may be equal to or smaller than the pitch of the bonding areas of the electric circuit components. When the smaller pitch is adopted, the connection between the electric circuit component and the electrical connecting member or electric bonding intermediary can be attained without requiring precise location of these two members.

It is not always necessary that the metallic member extends vertically through the insulating holder. In other words, the metallic members may extend slantwise from the end adjacent to the first electric circuit component to the end adjacent to the second electric circuit component.

Holding Member of Electric Bonding Intermediary Used in the Invention

The holding member of the electric bonding intermediary used in the present invention may comprise, for example, an electrically insulating material. An organic or an inorganic material may be used as the electrically insulating material. A metallic material may also be used as the holding member when it is treated to electrically insulate the conductive members from each other.

In addition, one kind or a plurality of kinds of powder, fiber or material having any desired shape, all of which comprise inorganic or metallic material, may be dispersed in the organic material. In contrast, one kind or a plurality of kinds of powder, fiber or material having any desired shape, all of which comprise organic or metallic material, may be dispersed in the inorganic material. Furthermore, one kind or a plurality of kinds of powder, fiber or material having any desired shape, all of which comprise organic or inorganic material, may be dispersed in the metallic material.

Examples of resins suitably used are polyimide resin, polyphenylene sulfide resin, polyether sulfone resin, polyether imide resin, polysulfone resin, silicone resin, fluororesin, polycarbonate resin, polydiphenylether resin, polybenzyl imidazole resin, phenol resin, urea resin, melamine resin, alkyd resin, epoxy resin, polyamideimide resin, polypropylene resin, polyvinyl chloride resin, polystyrene resin, methacrylate methyl, polyphenylene oxide, methacrylic resins, vinylidene chloride, and so forth.

It is advisable to use a resin having a superior heat conductivity, so that the heat generated by the semiconductor device can be efficiently radiated. It is also preferred that the resin used as the material of the insulating holder has a thermal expansion coefficient which well approximates that of the circuit substrate so that any trouble attributable to thermal expansion and contraction may be eliminated, thus assuring high reliability of the product device.

Metals suitably used as the material of powder particles or fibers are Ag, Cu, Au, Al, Be, Ca, Mg, Mo, Ni, Si and W. Alloys of these metals also are usable as the material of the powder particles or fibers. The powder particles and the fibers may or may not have been subjected to a surface treatment such as plating.

Inorganic materials suitably used as the material of powder particles or fibers are materials other than metallic materials and organic materials. Examples of such inorganic material are ceramics such as SiC, BeO, $B_2C$, TaC, $TiB_2$, $CrB_2$, TiN, BP, BN, AlN, $Si_3N_4$ and $SiO_2$, diamond, C, B, glass, and so forth.

Metallic pieces and/or inorganic pieces of any desired forms may also be embedded in the holding member. The metallic pieces and/or inorganic pieces may have any suitable form such as tabular form, rod-like form with various cross-sectional shapes, spheres, and so forth.

Examples of material of the metallic pieces suitably used are Ag, Cu, Au, Al, Be, Ca, Mg, Mo, Ni, Si, W, Fe, Sn, Zn, and so forth, as well as alloys of these metals.

Examples of the inorganic pieces are ceramics, such as SiC, BeO, $B_4C$, TaC, $TiB_2$, $CrB_2$, TiN, BP, BN, AlN, $Si_3N_4$, $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZnO_2$, $P_2O_5$, $TiO_2$, MgO and $Ta_2O_5$, diamond, C, B, glass, and so forth.

Factors such as the size, shape, location and quantity of the powder particles, fibers and pieces dispersed in the holding member may be determined suitably such that the dispersed powder particles, fibers and pieces do not cause troubles such as mutual contact between adjacent metallic members, short-circuiting, breakdown of the metallic members, and so forth. It is, however, preferred that the size of the powder particles, fibers or pieces is smaller than the distance between adjacent metallic members, so that adjacent metallic members may not electrically contact each other through the powder particles, fibers and pieces. The dispersed powder particles, fibers and/or pieces may be exposed to the outside provided that they do not impair the desired electrical connection between the electric circuit component. The powder particles, as well as the fibers and pieces, may or may not contact with adjacent ones.

When one of the aforementioned resins is used as the material of the holding member, the dispersion of the powder particles, fibers or pieces can be effected by adding the powder particles, fibers and/or pieces to the resin and then mixing the resin, although other dispersion methods may be employed.

An electrical connecting member or electric bonding intermediary featuring the above materials exhibits a high heat conductivity by virtue of the dispersion of the powder particles, fibers and/or pieces of a metal or an alloy. Such a connecting member or bonding intermediary, therefore, can suitably be used in such a case that the first electric circuit component produces much heat, while the second electric circuit component is comparatively resistant to heat. In such a case, the heat generated in the first electric circuit component is transmitted through the connecting member or bonding intermediary to the second electric circuit component and then radiated from the latter. It is thus possible to obtain an electric circuit device having superior heat radiation characteristics.

Alternatively, the holding member may comprise a metallic material. In this case, an electrically insulating material must be provided between the conductive members and the holding member.

Examples of the metallic or alloy material suitably used as the material of the holder are Ag, Cu, Au, Al, Be, Ca, Mg, Mo, Ni, Si, W, Fe, Ti, In, Sn, Zn, and so forth, as well as alloys of these metals.

The provision of the insulating material between each metallic member and the holder may be achieved through various methods.

For instance, when the holder is made of a material which can be anode-oxidated, e.g., Al or Ti, bores are formed in predetermined portions of the holder so as to receive the metallic members and then the holder is subjected to anode oxidation so that anode-oxidation films which effectively serve as insulating layers are formed on the surfaces of the bores.

It is also possible to form, on the surfaces of the bores formed in the holder an oxide film, a nitride film, a boride film or a carbide film, by subjecting the holder to oxidation, nitriding, boriding or carburizing.

It is also possible to form the insulating material by subjecting the holder to flame spraying or evaporation with, for example, ceramics, after forming bores in the holder.

The insulating material also may be formed by applying a resin to the surfaces of bores formed in the holder.

In a further method, a suitable treatment such as oxidation, nitriding, boriding or carburizing is effected on the boundaries between the metallic members and the holder so that the metallic members are electrically isolated from the holder. In this method, the holder and the metallic member are made of the same metal or alloy. The formation of the insulating material may be effected on both sides of the connecting member or bonding intermediary, or only on the side of the connecting member or bonding intermediary adjacent to the first electric circuit component or the side adjacent to the second electric circuit component.

In a still further method, an intermediary member made of a resin or an inorganic material is disposed between each metallic member and the wall of the bore in the holder receiving each metallic member. For instance, a tubular member is fitted in each bore so as to fit on each metallic member.

When the intermediary member is made of a resin, the invention does not restrict the type of resin. For instance, an electrically insulating resin material can suitably be used.

Examples of the resins suitably used are polyimide resin, polyphenylene sulfide resin, polyether sulfone resin, polyether imide resin, polysulfone resin, silicone resin, fluororesin, polycarbonate resin, polydiphenylether resin, polybenzyl imidazole resin, phenol resin, urea resin, melamine resin, alkyd resin, epoxy resin, polyamideimide resin, polypropylene resin, polyvinyl chloride resin, polystyrene resin, and so forth.

When such a resin is used, the resin may contain fillers such as powder particles, fibers and/or pieces of a metallic material or an inorganic material dispersed therein as described above.

When the intermediary member disposed between each metallic member and the wall of each bore in the holder is made of an inorganic material, the inorganic material may be one selected from ceramics such as $SiO_2$, $B_2O_3$, $At_2O_3$, $Na_2O$, $K_2O$, CaO, ZnO, BaO, PbO, $Sb_2O_3$, $As_2O_3$, $La_2O_3$, $ZrO_2$, BaO, $P_2O_5$, $TiO_2$, MgO, SiC, BeO, BP, BN, AlN, $B_4C$, TaC, $TiB_2$, $CrB_2$, TiN, $Si_3N_4$, and $Ta_2O_5$, diamond, C, B, glass, and so forth.

Preferably, the resin used has a high heat conductivity so that heat produced by the semiconductor device may be radiated through the resin or inorganic material.

An electrical connecting member or electric bonding intermediary featuring such a metallic holder exhibits a high heat conductivity from the first electric circuit component to the second electric circuit component and vice versa. Such a connecting member or bonding intermediary, therefore, can suitably be used in such a case that the first electric circuit component produces much heat, while the second electric circuit component is comparatively resistant to heat. In such a case, the heat generated in the first electric circuit component is transmitted through the electric bonding intermediary to the second electric circuit component and then radiated from the latter. It is thus possible to obtain an electric circuit device having superior heat radiation characteristics. It is also to be understood that the metallic or alloy holder effectively prevents any noise of the electric circuit component from leaking outside, while excluding external noises.

Alternatively, the holding member may comprise an inorganic material. Examples of the resin suitable for use as the material of the holder are $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, BaO, $P_2O_5$, $TiO_2$, MgO, SiC, BeO, BP, BN, AlN, B, C, TaC, $TiB_2$, $CrB_2$, TiN, $Si_3N_4$, and $Ta_2O_5$, diamond, C, B, glass, and so forth.

The inorganic material of the holder of the electric bonding intermediary can contain fillers such as described above.

When the inorganic material used as the material of the holder is an electrically conductive material, an intermediate member made of an electrically insulating material such as an inorganic material or a resin is placed between each electric member and the holder so as to electrically insulate the metallic member.

The use of the intermediate member is not necessary when the inorganic material used as the material of the holder is a non-conductive material. In such a case, however, an intermediate member such as of a metal, an inorganic material or a resin may be used for the purpose of improving conduction of heat, thereby enhancing heat radiation.

Examples of the metallic material suitably used as the material of such an intermediate member are Ag, Cu, Au, Al, Be, Ca, Mg, Mo, Ni, Si, W, Fe, Ti, In, Sn, Zn and so forth, as well as alloys of these metals.

The invention does not impose any restriction on the type of the resin used as the material of the intermediate member. Thus, any thermosetting resin, ultraviolet setting resin or thermoplastic resin can be used suitably. Examples of the resins suitably used are polyimide resin, polyphenylene sulfide resin, polyether sulfone resin, polyether imide resin, polysulfone resin, silicone resin, fluororesin, polycarbonate resin, polydiphenylether resin, polybenzyl imidazole resin, phenol resin, urea resin, melamine resin, alkyd resin, epoxy resin, polyamideimide resin, polypropylene resin, polyvinyl chloride resin, polystyrene resin, and so forth.

The resin may contain metallic and/or inorganic fillers in the form of powder particles, fibers and/or pieces dispersed therein as described above.

It is advisable that the metal, resin or the inorganic material used as the material of the intermediate member have a high heat conductivity so that the heat generated in the semiconductor device may efficiently radiate through the intermediate member.

An electrical connecting member or electric bonding intermediary featuring a holder made of an inorganic material provides for the efficient conduction of heat from the first electric circuit component to the second electric circuit component and vice versa. Such a connecting member or bonding intermediary features a high level of heat conductivity and, therefore, can suitably be used in such cases where a component having a large heat generation is used as the first electric circuit component while the second electric circuit component has a high durability to heat. In such cases, the heat generated in the first electric circuit component is quickly transmitted to the second electric circuit component and efficiently radiated therefrom. It is thus possible to obtain an electric circuit device having superior heat radiation characteristics.

Figure 10A:
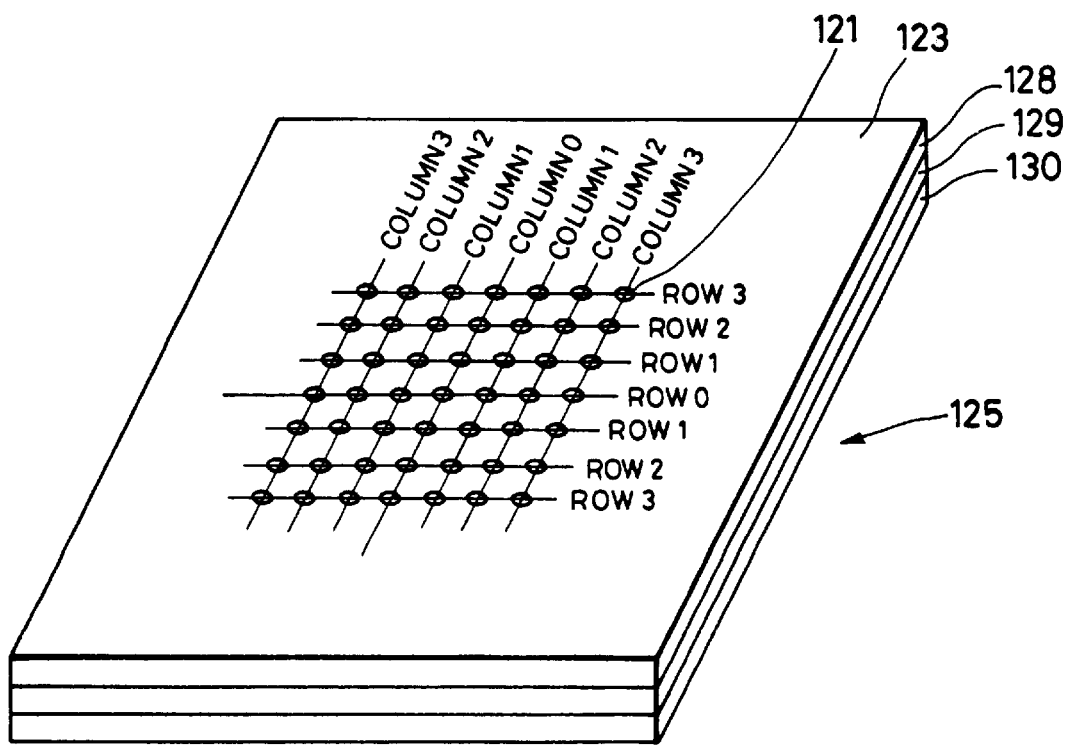
FIGS. 10A and 10B show an electrically connecting member of an embodiment.
Figure 10B:
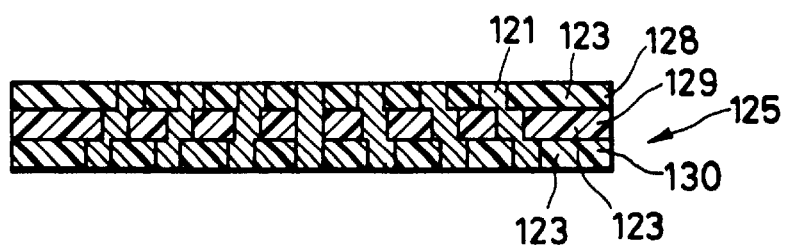

Embodiments of the Electrical Connecting Member and Electrical Bonding Intermediary of the Invention First Embodiment FIGS. 10A and 10B show an electrical connecting member suitable for use as the first embodiment the present invention, in perspective and sectional view, respectively.

Figure 11A:
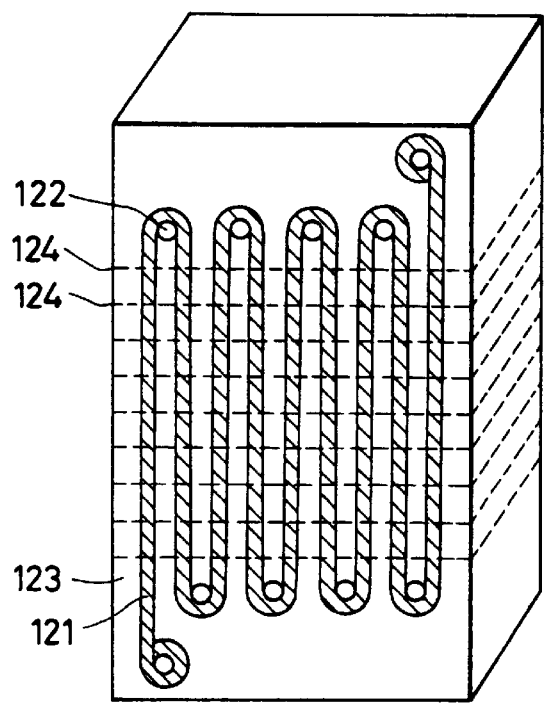
FIGS. 11A, 11B and 11C are views for explaining an example of a manufacturing process for an electrically connecting member used in said embodiment.
Figure 11B:
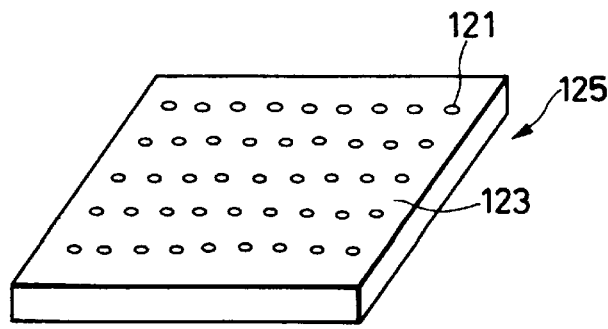
Figure 11C:
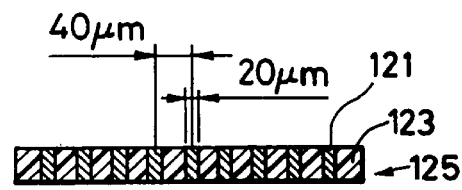

FIGS. 11A to 11C illustrate the process for producing the elementary electric bonding intermediary 125 used in the first embodiment.

As shown in FIG. 11A, a metallic wire 121 made of a metal such as gold or a suitable alloy and having a diameter of about 20 mm is turned around a plurality of bars 122 at a pitch of 40 mm, and the wire 121 together with the bars 122 are embedded in a resin body 123 such as of polyimide resin. The resin after setting serves as an insulator. After the setting of the resin, the resin body 123 is sliced as indicated by broken lines 124, whereby a plurality of electric bonding intermediaries 125 are obtained as shown in FIGS. 11B and 11C.

In this electric bonding intermediary 125, the metallic wires 121 as the metallic members are insulated from one another by the resin 123. It will be seen that one end of each of the metallic wires 121 is exposed on the surface of the electric bonding intermediary 125, while the other end of each of the metallic wires 121 is exposed on the opposite surface of the electric bonding intermediary 125. These exposed portions of the metallic wires 121 constitute bonding areas 108, 109 where the bonding intermediary is to be bonded to the electric circuit components.

The method for fabricating the connecting member of the first embodiment will be described hereinunder with reference to FIGS. 10A and 10B. Three pieces 128, 129 and 130 of elementary electric bonding intermediary are prepared by the method explained above.

In the first piece 128 of the electric bonding intermediary, the metallic wires 121 are so located that the position of the metallic wire 121 in a row m and a column n is offset from the center by amounts ma and nb in the line and column directions. In the second piece 129 of the electric bonding intermediary, the metallic wires 121 are so located that the position of the metallic wire 121 in row m and column n is offset from the center by amounts mac and nbc in the line and column directions. In the third piece 130 of the electric bonding intermediary, the metallic wires 121 in row m and column n is offset from the center by amounts mad and nbd in the line and column directions. The values a, b c and d are so determined that the metallic members in each piece can make electric contact only with the metallic members which are immediately above and below these metallic members but do not contact with metallic members laterally offset therefrom. Then, the electric bonding intermediary 125 is completed by stacking three pieces of the member and then bonding them together by, for example, applying heat and pressure.

Although the metallic members in each piece of elementary bonding intermediary member are regularly arranged in the form of a matrix having m rows and n columns, this is not exclusive and the metallic members in each piece may be disposed in a random manner, provided that the metallic members in each piece can make electric contact only with the metallic members which are immediately above and below these metallic members but do not contact with metallic members laterally offset therefrom.

It is also to be understood that the electric bonding intermediary may be composed of two pieces of elementary members or four or more elementary members, although a bonding intermediary consisting of three elementary members was specifically mentioned.

The bonding by application of heat and pressure also is illustrative, and various other suitable methods such as a mere pressing and adhesion can be employed as the occasion demands.

Second Embodiment

Figure 12A:
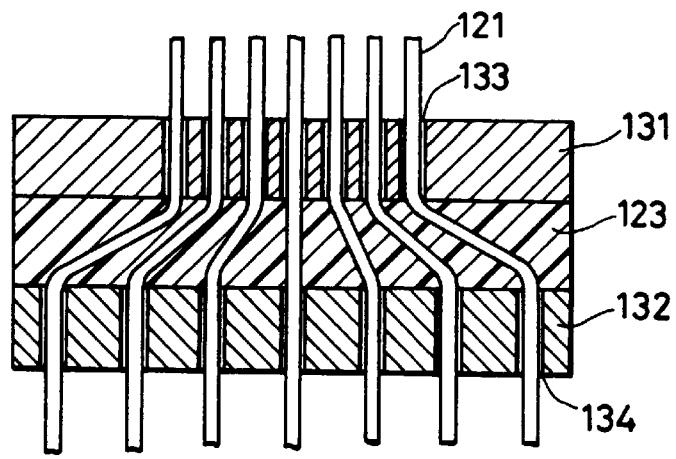
FIGS. 12A, 12B and 12C show an example of a manufacturing process of an electrically connecting member of still another embodiment.

FIG. 12A is a sectional view of a half-finished electric bonding intermediary suitable for use as the second embodiment of the electric bonding intermediary of the present invention. FIGS. 20B and 20C are a perspective and a section view of the bonding intermediary, respectively.

This bonding intermediary is prepared by the following method. A pair of metal wire guide plates 131 and 132 are prepared and metal wires 121 are threaded through holes 133, 134 formed in these guide plates 131, 132. Then, the wires are tensed at a suitable level of tension. Subsequently, the space between the guide plates 131, 132 is filled with resin 123. After the setting of the resin, the guide plates 131 and 132 are demounted, whereby the electric bonding intermediary 125 is formed.

Figure 13A:
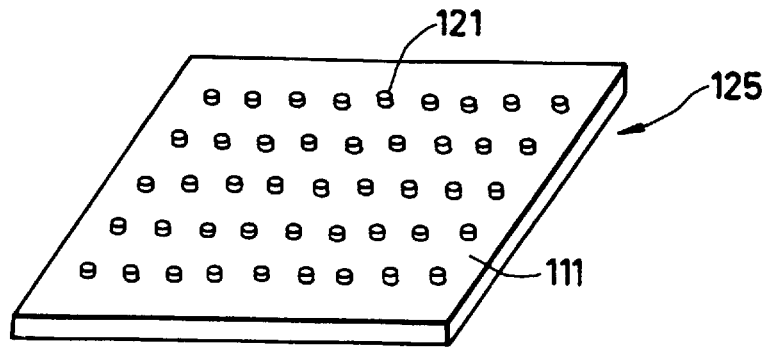
FIGS. 13A, 13B, 14A and 14B show said embodiment.
Figure 13B:
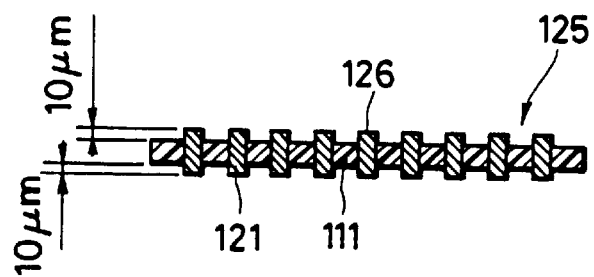
Figure 14A:
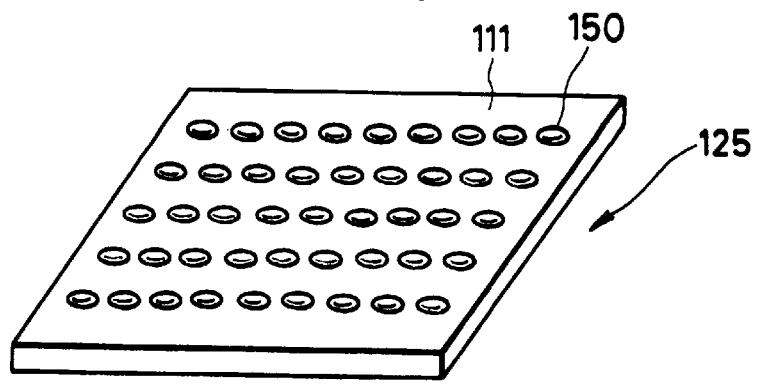
Figure 14B:
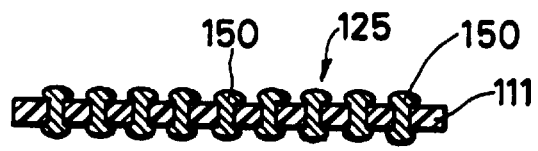

The first or second embodiment may be modified such that it has projections as is the case of the bonding intermediary shown in FIGS. 13A, 13B or such that it has bumps as is the case of the bonding intermediary shown in FIGS. 14A, 14B.

As will be understood from FIGS. 13A and 13B, in the electric bonding intermediary 125 used in this embodiment, the exposed ends of the metallic members 107 are slightly projected from the surfaces of the resin insulator 111.

This type of electric bonding intermediary 125 can be fabricated by preparing a member of the type shown in FIGS. 11B and 11C described before, and subjecting the surfaces of the member to an etching until the metallic wires 121 project from the surfaces of the polyimide resin body 123 by a length of, for example, 10 μm or so.

The fabrication of this type of electric bonding intermediary by etching is only illustrative and other suitable chemical or mechanical methods can be used equally well.

It is possible to form bumps 150 as shown in FIGS. 14A and 14B, by placing the electric bonding intermediary 125 between a pair of dies having recesses corresponding to the metallic wires 121 and then compacting the dies so as to collapse the projecting portions 126 of the metallic wires 121. The provision of the bumps 150 effectively prevent the metallic wires from coming off the insulator 111.

The bumps may also be formed by heating and melting the projections or other suitable method.

Third Embodiment

Figure 15A:
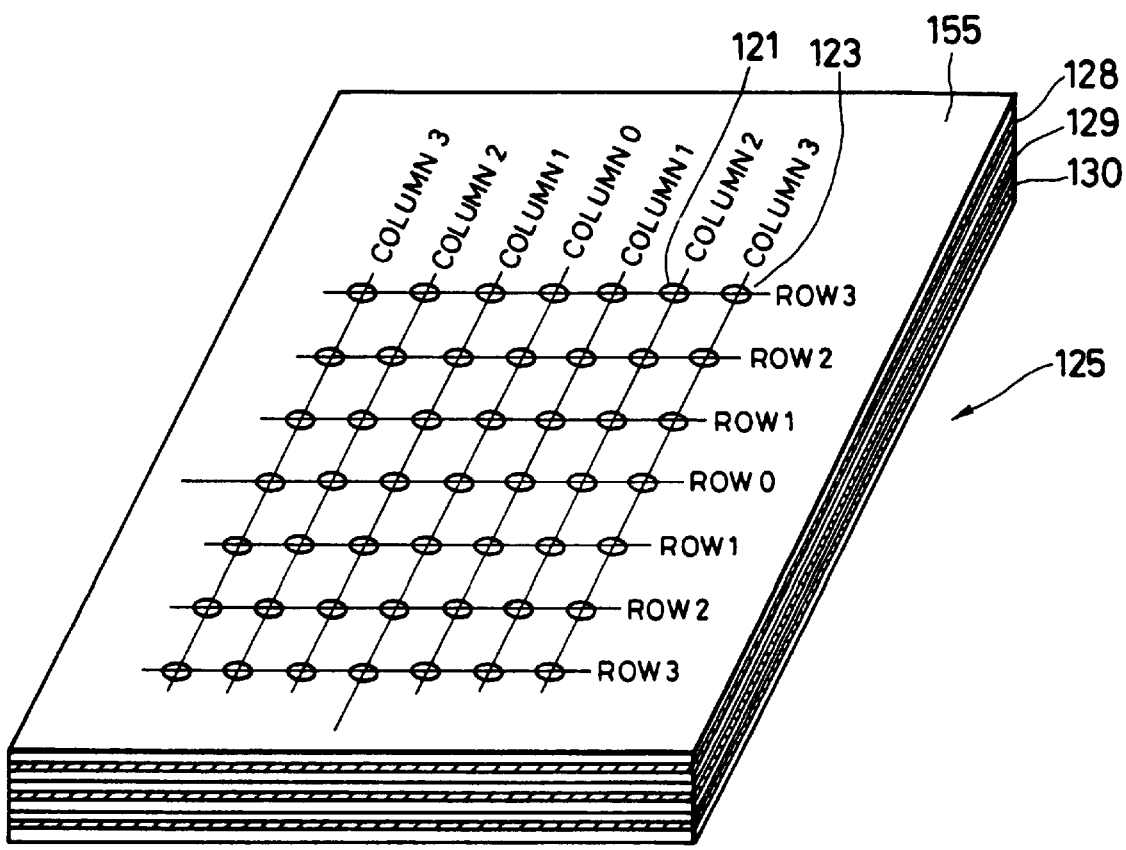
FIGS. 15A and 15B show an electrically connecting member of another embodiment.
Figure 15B:
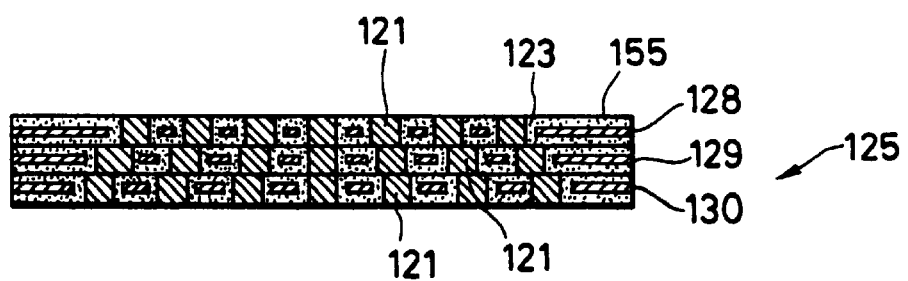

FIGS. 15A and 15B show an electrical connecting member suitable for use as the third embodiment of the present invention, in perspective and sectional view, respectively.

Figure 16A:
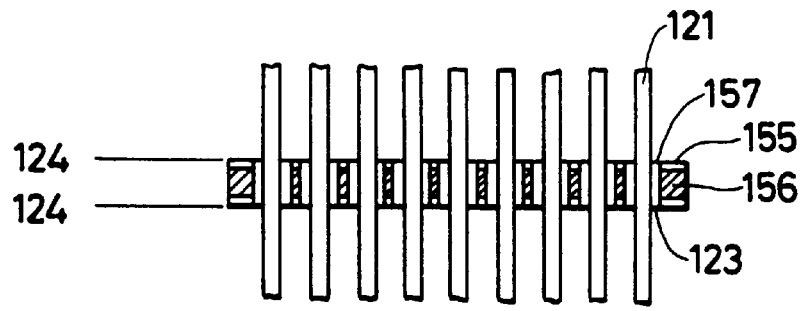
FIGS. 16A, 16B and 16C are views for explaining an example of a manufacturing process for an electrically connecting member used in said embodiment.
Figure 16B:
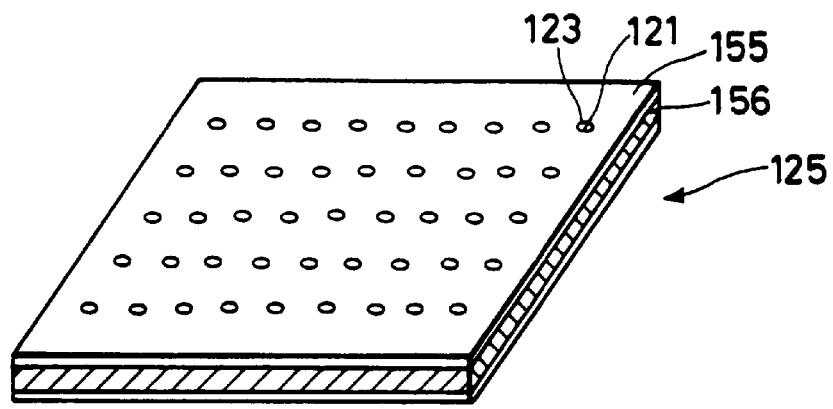
Figure 16C:
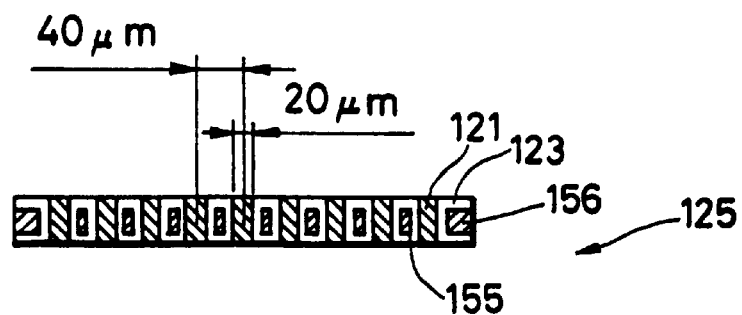

FIGS. 16A to 16C illustrate the process for producing the elementary electric bonding intermediary 125 used in the third embodiment.

As shown in FIG. 16A, an insulating sheet 155 is adhered to each side of the iron plate 156. Thereafter, bores 157 are formed at a pitch of 40 μm at positions where a metallic wire 121 of a metal such as gold or an alloy and having a diameter of about 20 μm is to be inserted. The diameter of the bores 157 is slightly greater than the diameter of the metallic wire 121. After threading the metallic wire 121 through the bores 157, the bores 157 are charged with a resin 123. After setting, the resin 123 serves as the insulator, so that each section of the metallic wire is insulated from the others. After the setting of the resin, the resin body 123 is sliced as indicated by broken lines 124, whereby a plurality of pieces of elementary electric bonding intermediary 125 are obtained as shown in FIGS. 16B and 16C.

In this electric bonding intermediary 125, the segments of the metallic wires 121 constitute the metallic members 107, while the iron plate 156, insulating sheet 155 and the resin body 123 constitute the insulator 111. In this electric bonding intermediary 125, the segments of the metallic wires 121 as the metallic members are insulated from one another by the resin 123. It will be seen that one end of each of the metallic wires 121 is exposed on the surface of the electric bonding intermediary 125, while the other end of each of the metallic wires 121 is exposed on the opposite surface of the electric bonding intermediary 125. These exposed portions of the metallic wires 121 constitute bonding areas 108, 109 where the bonding intermediary is to be bonded to the electric circuit components.

The method for fabricating the bonding intermediary of the third embodiment will be described hereinunder with reference to FIGS. 15A and 15B. Three pieces 128, 129 and 130 of elementary electric bonding intermediary are prepared by the method explained above.

In the first piece 128 of the electric bonding intermediary, the metallic wires 121 are so located that the position of the metallic wire 121 in a row m and a column n is offset from the center by amounts ma and nb in the line and column directions. In the second piece 129 of the electric bonding intermediary, the metallic wires 121 are so located that the position of the metallic wire 121 in row m and column n is offset from the center by amounts mac and nbc in the line and column directions. In the third piece 130 of the electric bonding intermediary, the metallic wires 121 in row m and column n is offset from the center by amounts mad and nbd in the line and column directions. The values a, b c and d are so determined that the metallic members in each piece can make electric contact only with the metallic members which are immediately above and below these metallic members but do not contact with metallic members laterally offset therefrom. Then, the electric bonding intermediary 125 is completed by stacking three pieces of the member and then bonding them together by, for example, applying heat and pressure.

Although the metallic members in each piece of elementary bonding intermediary member are regularly arranged in the form of a matrix having m rows and n columns, this is not exclusive and the metallic members in each piece may be disposed in a random manner, provided that the metallic members in each piece can make electric contact only with the metallic members which are immediately above and below these metallic members but do not contact with metallic members laterally offset therefrom.

It is also to be understood that the electric bonding intermediary may be composed of two pieces of elementary members or four or more elementary members, although a bonding intermediary consisting of three elementary members was specifically mentioned.

The bonding by application of heat and pressure also is illustrative, and various other suitable methods such as a mere pressing and adhesion can be employed as the occasion demands.

Fourth Embodiment

Figure 17A:
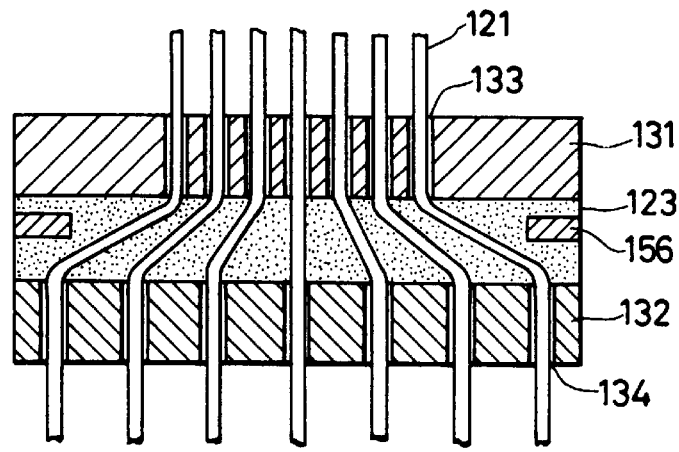
FIGS. 17A, 17B and 17C show an example of a manufacturing process of an electrically connecting member in another embodiment.
Figure 17B:
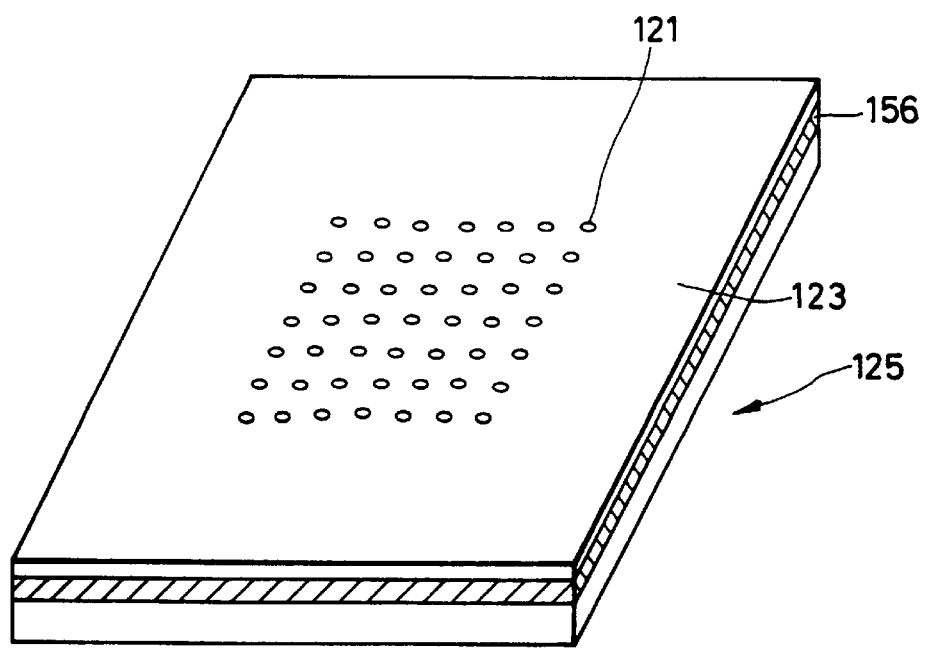
Figure 17C:
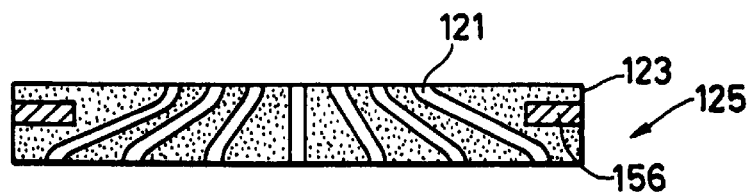

FIG. 17A is a sectional view of a half-finished electric bonding intermediary suitable for use as the fourth embodiment of the electric bonding intermediary of the present invention. FIGS. 17B and 17C are a perspective and a sectional view of the bonding intermediary, respectively.

This bonding intermediary is prepared by the following method. A pair of metal wire guide plates 131 and 132 and an iron plate 156 are prepared and the iron plate is placed and held between the metallic wire guide plates 131, 132. Then, the metal wires 121 are threaded through holes 133, 134 formed in these guide plates 131, 132. Then, the wires are tensed at a suitable level of tension. Subsequently, the space between the guide plates 131, 132 is filled with resin 123. After the setting of the resin, the guide plates 131, 132 are demounted, whereby the electric bonding intermediary 125 is formed.

Figure 18A:
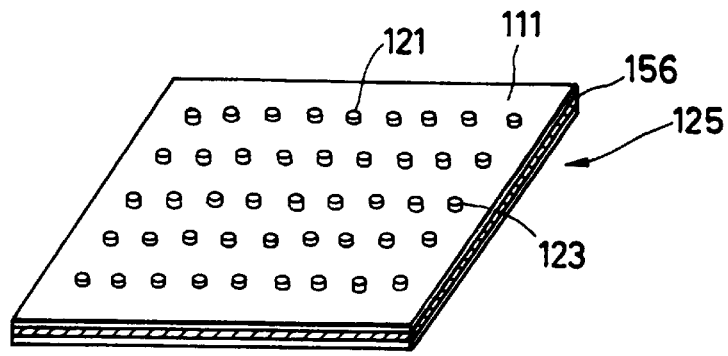
FIGS. 18A, 18B, 19A and 19B show said embodiment.
Figure 18B:
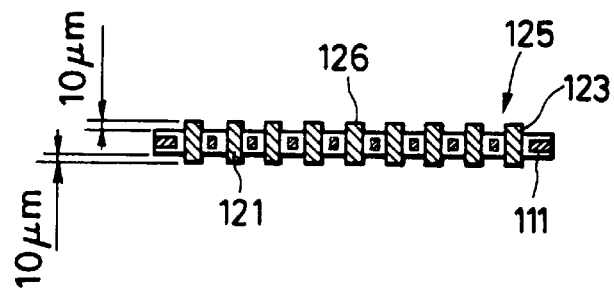
Figure 19A:
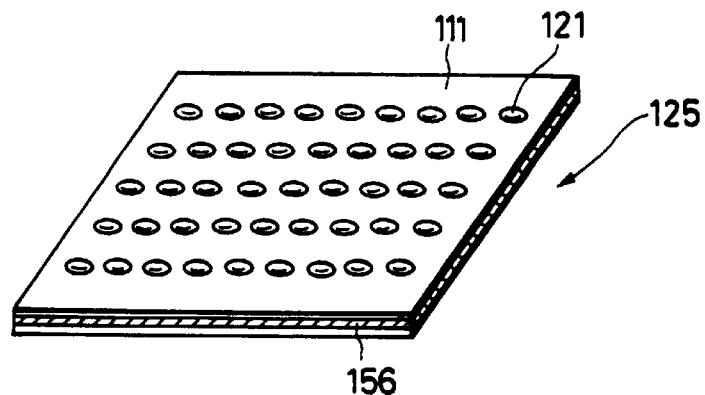
Figure 19B:
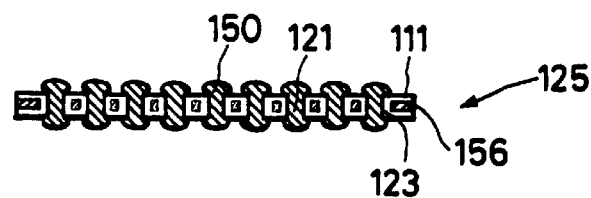

The electric bonding intermediary of the third or fourth embodiment may be modified such that it has projections as is the case of the bonding intermediary shown in FIGS. 18A, 18B or such that it has bumps as is the case of the bonding intermediary shown in FIGS. 19A, 19B.

As will be understood from FIGS. 18A and 18B, in the electric bonding intermediary 125 used in this embodiment, the exposed ends of the metallic members 107 are slightly projected from the surfaces of the resin insulator 111.

This type of electric bonding intermediary 125 can be fabricated by preparing a member of the type shown in FIGS. 16B and 16C described before, and subjecting the surfaces of the member to an etching until the metallic wires 121 project from the surfaces of the polyimide resin body 123 by a length of, for example, 10 μm or so.

The fabrication of this type of electric bonding intermediary by etching is only illustrative and other suitable chemical or mechanical methods can be used equally well.

It is possible to form bumps 150 as shown in FIGS. 19A and 19B, by placing the electric bonding intermediary 125 between a pair of dies having recesses corresponding to the metallic wires 121 and then compacting the dies so as to collapse the projecting portions 126 of the metallic wires 121. The provision of the bumps 150 effectively prevent the metallic wires from coming off the insulator 111.

The bumps may also be formed by heating and melting the projections or other suitable method.

Fifth Embodiment

Figure 20A:
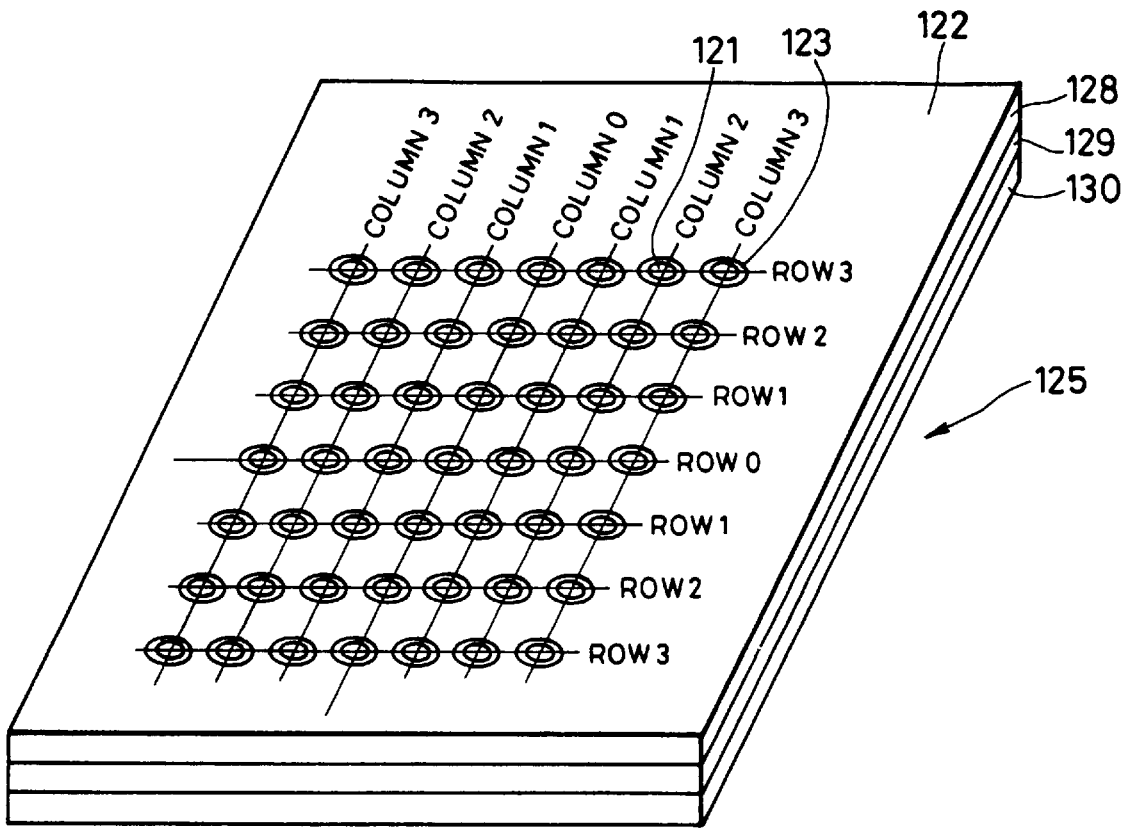
FIGS. 20A and 20B show an electrically connecting member in another embodiment.
Figure 20B:
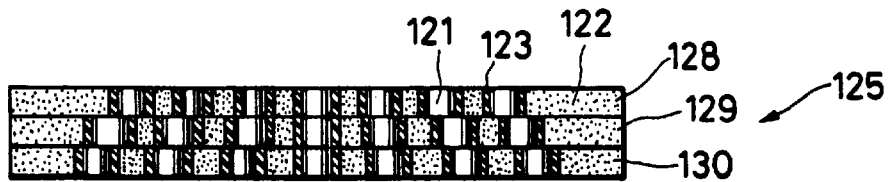

FIGS. 20A and 20B show an electric bonding intermediary suitable for use as the fifth embodiment of the electric bonding intermediary of the present invention, in perspective and sectional view, respectively.

Figure 21A:
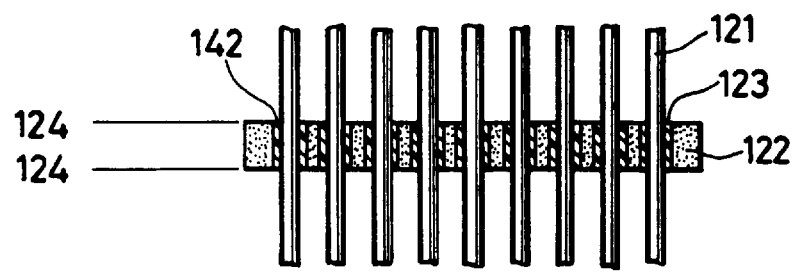
FIGS. 21A, 21B and 21C are views for explaining an example of a manufacturing process for an electrically connecting member for use in said embodiment.
Figure 21B:
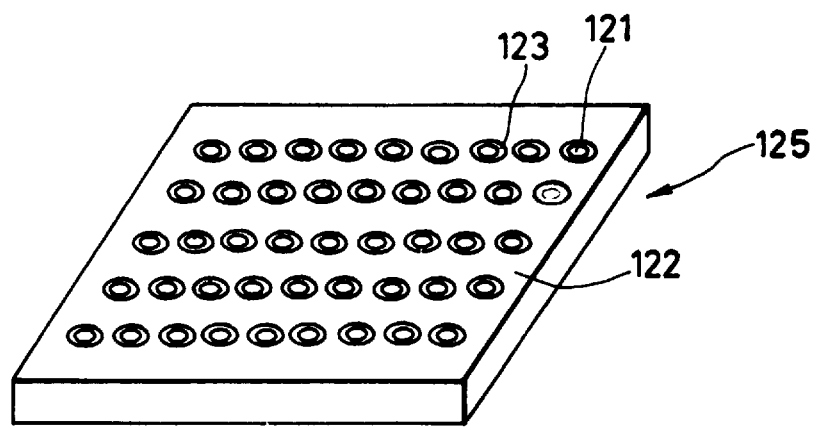
Figure 21C:
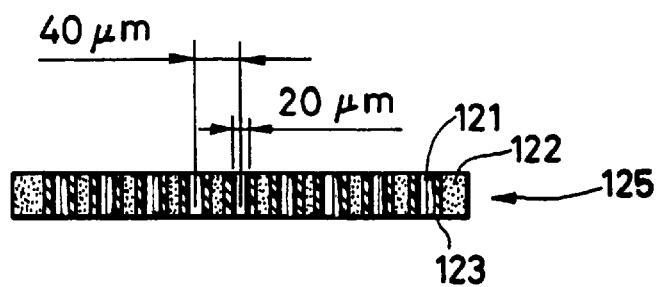

FIGS. 21A to 21C illustrate the process for producing the elementary electric bonding intermediary 125 used in the fifth embodiment.

As shown in FIG. 31A, the holes 142 with an inside diameter greater than 20 μm are bored in the holder 122 consisting of aluminum at pitches of 40 μm. Subsequently, the holder 122 is subjected to anodization treatment, and then the metallic wires 121 having a 20 μm diameter and formed of a metal such as gold or an alloy are inserted through the holes 142 of the holder 122. The resin 123 is then poured into spaces between the holder 122 formed of aluminum and the metallic wires 121, and the resin 123 is allowed to harden. The hardened resin 123 and anodized aluminum films (not shown) formed by anodization treatment serve as insulators. Subsequently, the metallic wires 121 are sliced at the positions of the dotted lines 124 thereby preparing the electrical bonding intermediary 125.

Incidentally, after the holder 122 is subjected to anodization treatment, the metallic wires 121 are inserted and the resin 123 is then allowed to harden. However, anodization treatment may be provided after hardening of the resin 123. In addition, it is possible to apply the resin 123 uniformly to the metallic wires 121 and then allow the metallic wires 1212 to be inserted through the holes 142 of the holder 122.

Furthermore, the slicing of the metallic wires 121 may be effected in a process preceding or following the process of anodization treatment.

In addition, although, the resin 123 is placed between each of the metallic wires 121 and aluminum holder 122, any electrically insulating material may be used instead of the resin 123. Furthermore, without using the resin 123, the metallic wires 121 may be brought into direct contact with the anodized aluminum films of the aluminum holder 122. In this case, the anodization treatment is effected before the electric wires 121 are inserted.

In addition, grinding may be performed to eliminate any drooping portions of the metallic wires 121. Furthermore, the drooping portions may be eliminated by another method without relying on grinding.

In such an electrical bonding intermediary 125 thus prepared, the metallic wires 121 constitute the metallic members 107, the resin 123 and the anodized aluminum films constitute the insulators 140, and the holder 122, the insulator 140 and the metallic members 107 constitute the electrical bonding intermediary 125.

In this electrical bonding intermediary, the metallic wires 121 serving as the metallic members are electrically insulated from each other by means of the resin 123. In addition, one end of each of the metallic wires 1212 is exposed on the surface of the bonding intermediary, while the other end of each of the metallic wires is exposed on the opposite surface of the bonding intermediary. These exposed portions constitute bonding areas 108, 109 to be electrically connected with electric circuit components.

The method for fabricating the bonding intermediary of the fifth embodiment will be described hereinunder with reference to FIGS. 20A and 20B. Three pieces 128, 129 and 130 of elementary electric bonding intermediary are prepared by the method explained above.

In the first piece 128 of the electric bonding intermediary, the metallic wires 121 are so located that the position of the metallic wire 121 in a row m and a column n is offset from the center by amounts ma and nb in the line and column directions. In the second piece 129 of the electric bonding intermediary, the metallic wires 121 are so located that the position of the metallic wire 121 in row m and column n is offset from the center by amounts mac and nbc in the line and column directions. In the third piece 130 of the electric bonding intermediary, the metallic wires 121 in row m and column n is offset from the center by amounts mad and nbd in the line and column directions. The values a, b c and d are so determined that the metallic members in each piece can make electric contact only with the metallic members which are immediately above and below these metallic members but do not contact with metallic members laterally offset therefrom. Then, the electric bonding intermediary 125 is completed by stacking three pieces of the member and then bonding them together by, for example, applying heat and pressure.

Although the metallic members in each piece of elementary bonding intermediary member are regularly arranged in the form of a matrix having m rows and n columns, this is not exclusive and the metallic members in each piece may be disposed in a random manner, provided that the metallic members in each piece can make electric contact only with the metallic members which are immediately above and below these metallic members but do not contact with metallic members laterally offset therefrom.

It is also to be understood that the electric bonding intermediary may be composed of two pieces of elementary members or four or more elementary members, although a bonding intermediary consisting of three elementary members was specifically mentioned.

The bonding by application of heat and pressure also is illustrative, and various other suitable methods such as a mere pressing and adhesion can be employed as the occasion demands.

Sixth Embodiment

Figure 22A:
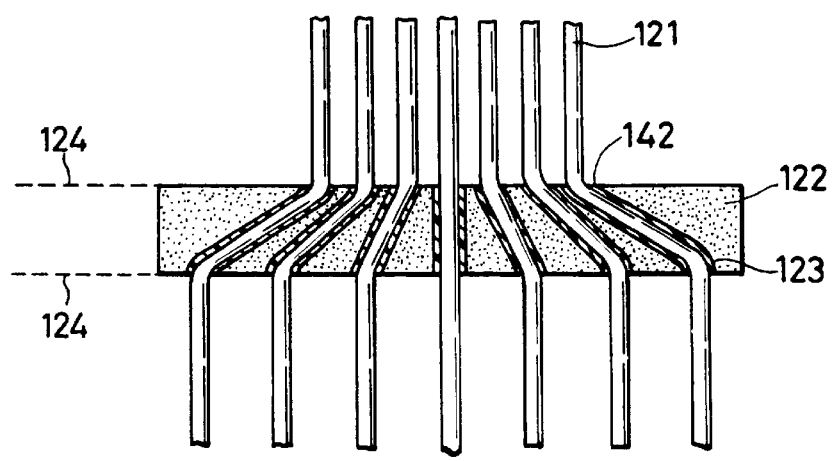
FIGS. 22A, 22B and 22C show an example of a manufacturing process of an electrically connecting member in another embodiment.
Figure 22B:
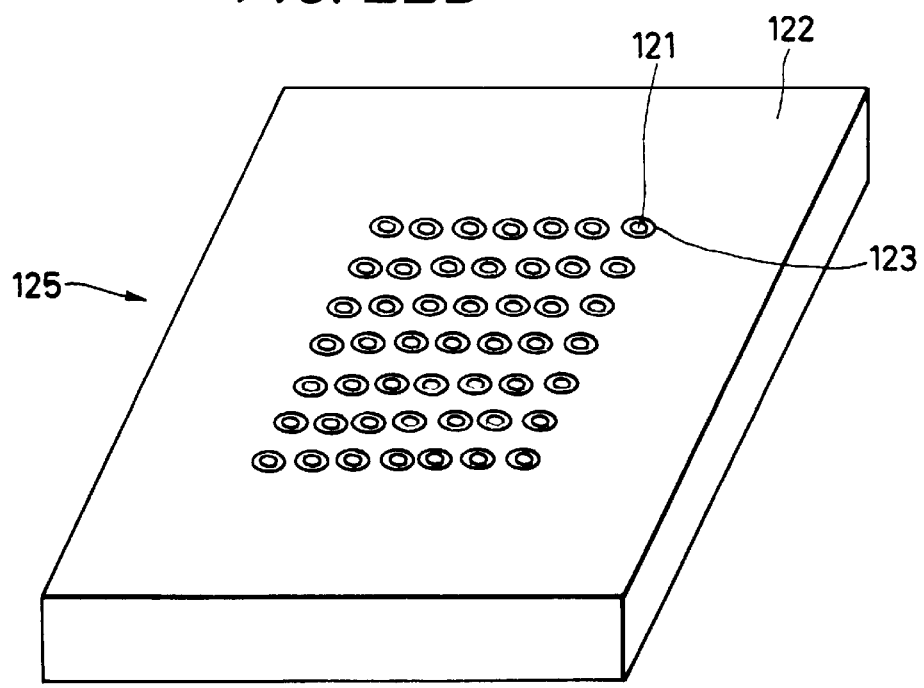
Figure 22C:
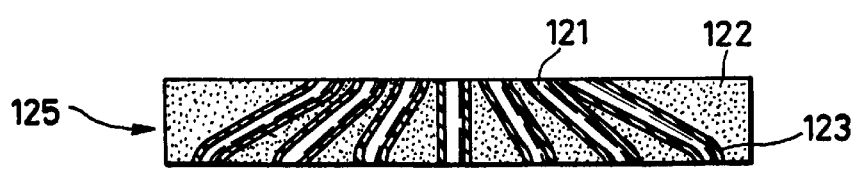

FIG. 22A is a sectional view of a half-finished electric bonding intermediary suitable for use as the sixth embodiment of the electric bonding intermediary of the present invention. FIGS. 22B and 22C are a perspective and a sectional view of the bonding intermediary, respectively.

This bonding intermediary is prepared by the following method. The holes 142 with an inside diameter greater than 20 μm are bored in the holder 122 provided with insulating films in advance. Subsequently, the metallic wires 121 having a 20 μm diameter and formed of a metal such as gold or an alloy are inserted through the holes 142, the resin 123 is poured into spaces between the holder 122 and the metallic wires 121 and is allowed to harden. The hardened resin 123 and the insulating films serve as insulating materials. Subsequently, the metallic wires 121 are sliced at the positions of the dotted lines 124 thereby to prepare the electrical bonding intermediary 125.

Figure 23A:
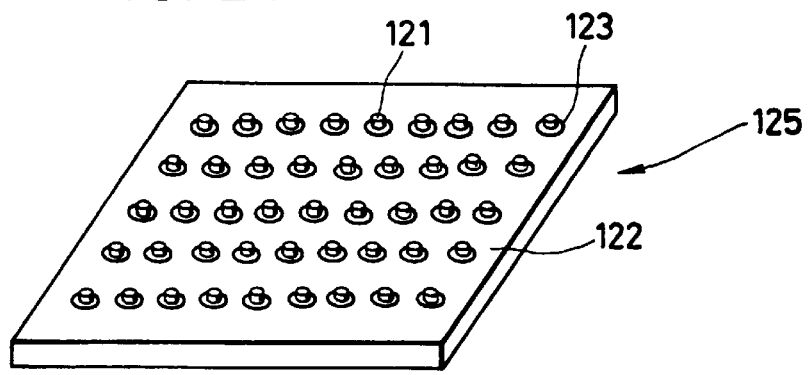
FIGS. 23A, 23B, 24A and 24B show said embodiment.
Figure 23B:
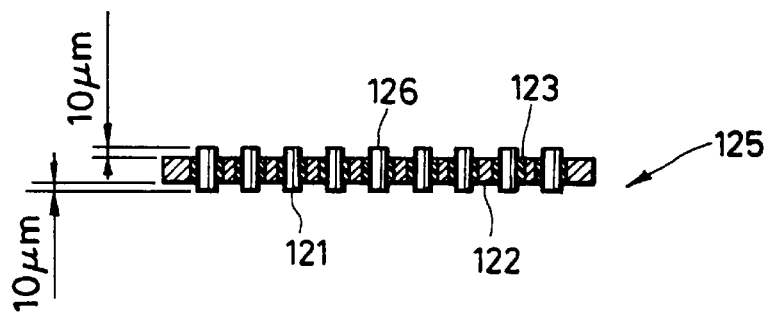
Figure 24A:
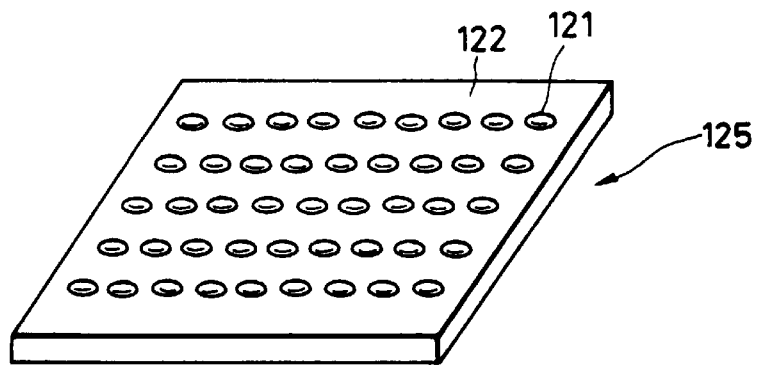
Figure 24B:
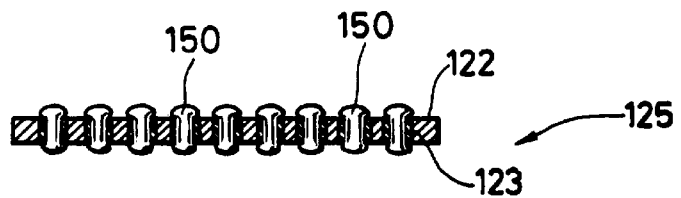

The electric bonding intermediary of the fifth or sixth embodiment may be modified such that it has projections as is the case of the bonding intermediary shown in FIGS. 23A, 23B or such that it has bumps as is the case of the bonding intermediary shown in FIGS. 24A, 24B.

As will be understood from FIGS. 23A and 23B, in the electric bonding intermediary 125 used in this embodiment, the exposed ends of the metallic members 107 are slightly projected from the surfaces of the resin insulator 111.

This type of electric bonding intermediary 125 can be fabricated by preparing a member of the type shown in FIGS. 21B and 21C described before, and subjecting the surfaces of the member to an etching until the metallic wires 121 project from the surfaces of the polyimide resin body 123 by a length of, for example, 10 μm or so.

The fabrication of this type of electric bonding intermediary by etching is only illustrative and other suitable chemical or mechanical methods can be used equally well.

It is possible to form bumps 150 as shown in FIGS. 24A and 24B, by placing the electric bonding intermediary 125 between a pair of dies having recesses corresponding to the metallic wires 121 and then compacting the dies so as to collapse the projecting portions 126 of the metallic wires 121. The provision of the bumps 150 effectively prevent the metallic wires from coming off the insulator 111.

The bumps may also be formed by heating and melting the projections or other suitable method.

Seventh Embodiment

Figure 25A:
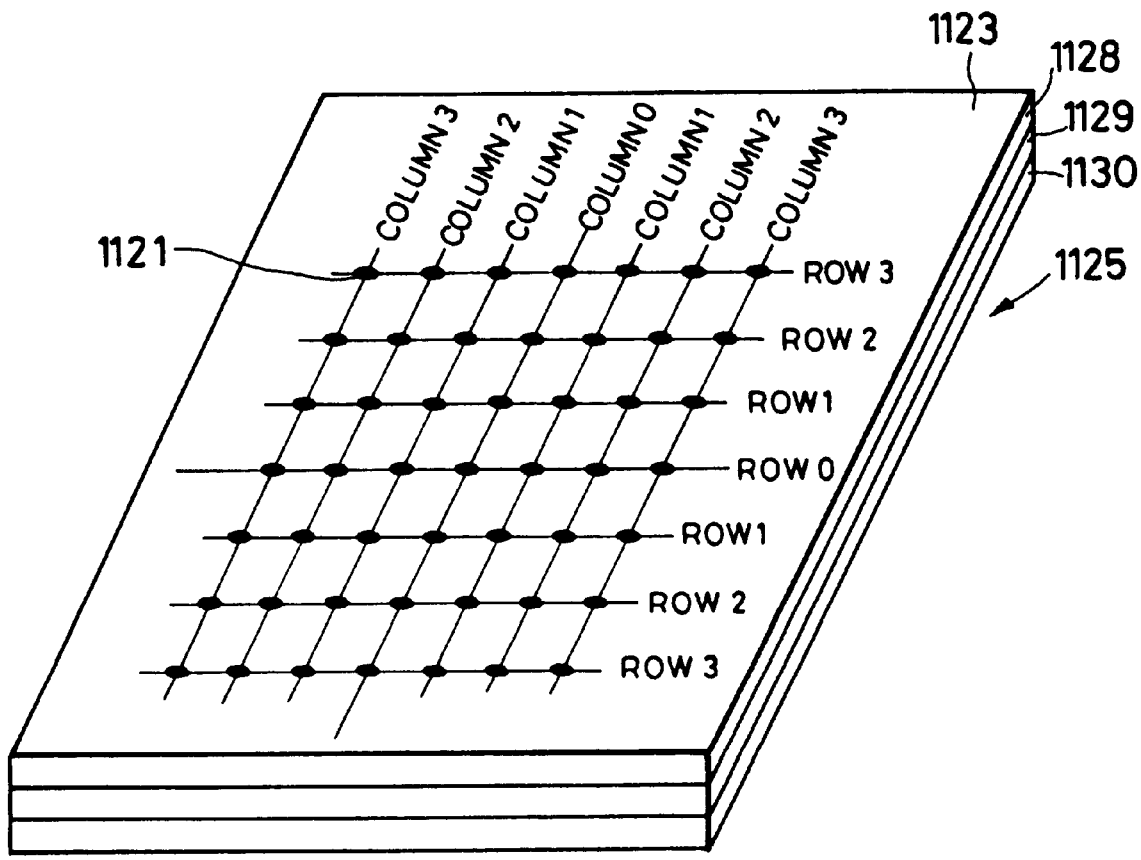
FIGS. 25A and 25B show an electrically connecting member in another embodiment.
Figure 25B:
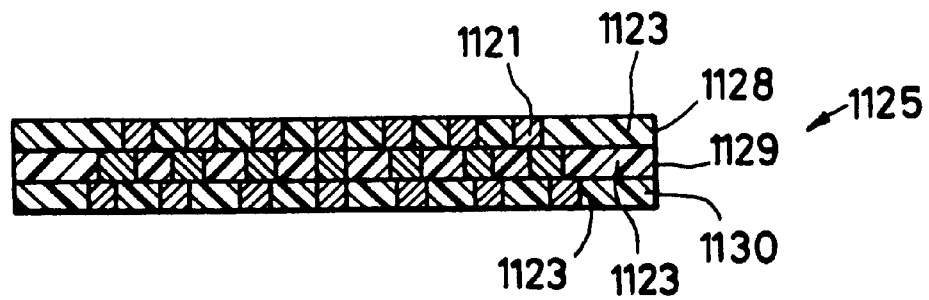

FIGS. 25A and 25B show an electric bonding intermediary suitable for use as the seventh embodiment of the electric bonding intermediary of the present invention, in perspective and sectional view, respectively.

Figure 26A:
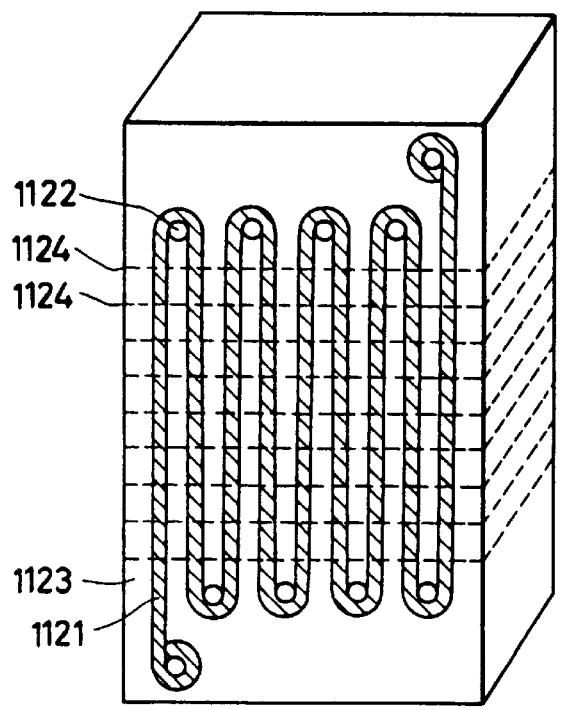
FIGS. 26A, 26B and 26C are views for explaining an example of a manufacturing process for an electrically connecting member for use in said embodiment.
Figure 26B:
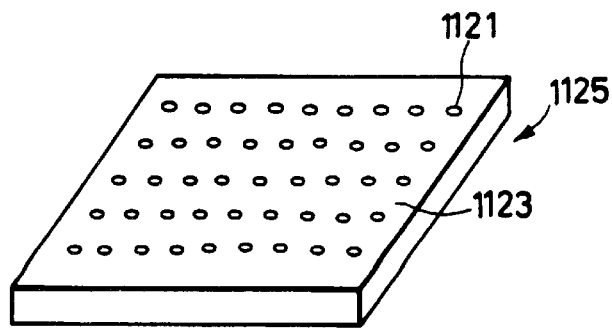
Figure 26C:
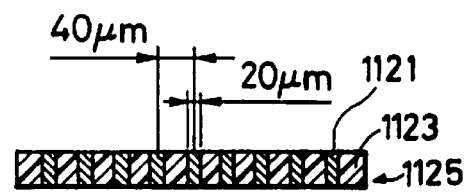

FIGS. 26A to 26C illustrate the process for producing the elementary electric bonding intermediary 1125 used in the seventh embodiment. Metal wires 1121 of a metal such as gold or an alloy thereof having a diameter of 20 μm are wound around rods 1122 at a pitch of 40 μm. Then, the metal wires 1121 are embedded into a resin 1128 such as polyimide. The resin 1128 is cured after the embedding. The cured resin becomes electrically insulative. The cured body is sliced along dotted lines into the electrical bonding intermediaries 1125.

In the connecting member 1125, the metal wires 1121 constitute the metal members 1107, and the resin 1123 constitutes the holder 1111.

The metal wires 1121 constituting the metal members are electrically insulated from each other by the resin 1123 in the connecting member 1125. One end of the metal wires 1121 is exposed on the surface of the bonding intermediary, while the other end thereof is exposed to the opposite surface of the bonding intermediary. The exposed parts of the wires 1121 serve as connecting portions 1108, 1109 to the electric circuit components.

The method for fabricating the bonding intermediary of the seventh embodiment will be described hereinunder with reference to FIGS. 25A and 25B. Three pieces 1128, 1129 and 1130 of elementary electric bonding intermediary are prepared by the method explained above.

In the first piece 1128 of the electric bonding intermediary, the metallic wires 1121 are so located that the position of the metallic wire 1121 in a row m and a column n is offset from the center by amounts ma and nb in the line and column directions. In the second piece 1129 of the electric bonding intermediary, the metallic wires 1121 are so located that the position of the metallic wire 1121 in row m and column n is offset from the center by amounts mac and nbc in the line and column directions. In the third piece 1130 of the electric bonding intermediary, the metallic wires 1121 in row m and column n is offset from the center by amounts mad and nbd in the line and column directions. The values a, b, c and d are so determined that the metallic members in each piece can make electric contact only with the metallic members which are immediately above and below these metallic members but do not contact with metallic members laterally offset therefrom. Then, the electric bonding intermediary 1125 is completed by stacking three pieces of the member and then bonding them together by, for example, applying heat and pressure.

Although the metallic members in each piece of elementary bonding intermediary member are regularly arranged in the form of a matrix having m rows and n columns, this is not exclusive and the metallic members in each piece may be disposed in a random manner, provided that the metallic members in each piece can make electric contact only with the metallic members which are immediately above and below these metallic members but do not contact with metallic members laterally offset therefrom.

It is also to be understood that the electric bonding intermediary may be composed of two pieces of elementary members or four or more elementary members, although a bonding intermediary consisting of three elementary members was specifically mentioned.

The bonding by application of heat and pressure also is illustrative, and various other suitable methods such as a mere pressing and adhesion can be employed as the occasion demands.

Eighth Embodiment

Figure 27A:
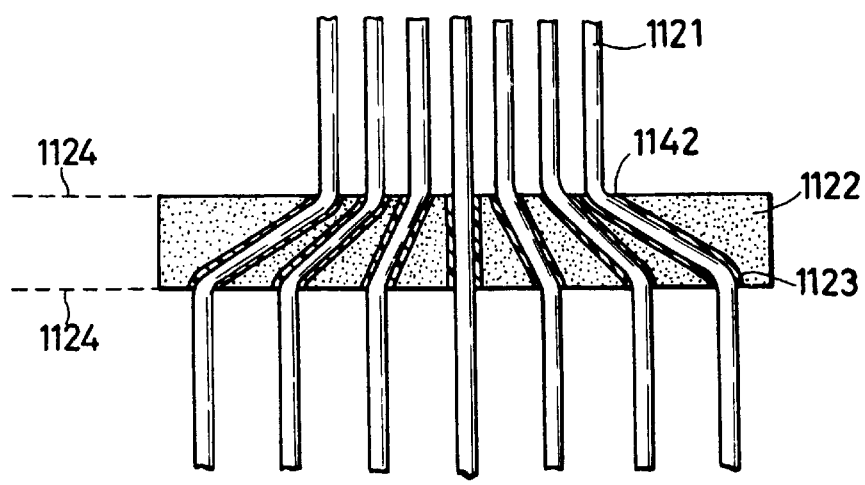
FIGS. 27A, 27B and 27C show an example of a manufacturing process of an electrically connecting member in another embodiment.
Figure 27B:
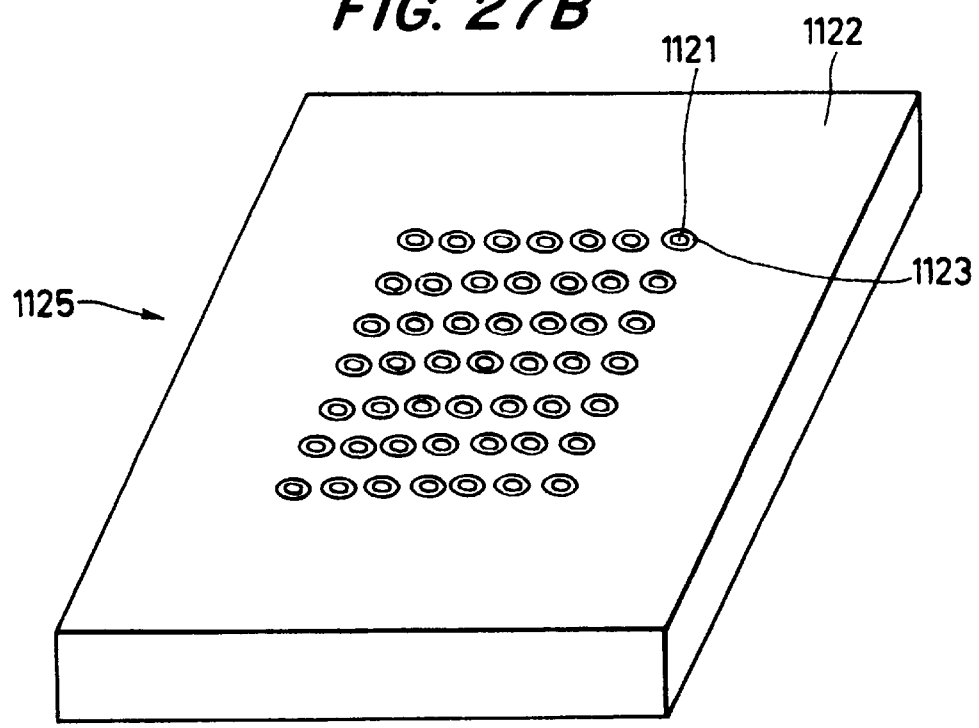
Figure 27C:
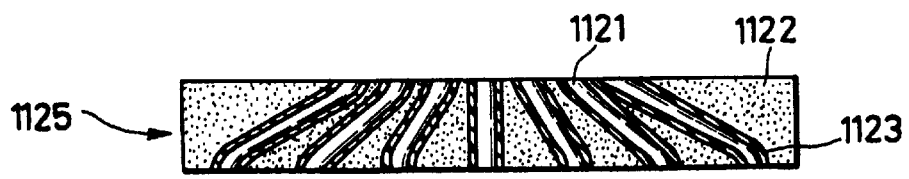

FIG. 27A is a sectional view of a half-finished electric bonding intermediary suitable for use as the eighth embodiment of the electric bonding intermediary of the present invention. FIGS. 27B and 27C are a perspective and a sectional view of the bonding intermediary, respectively.

Holes 1142 of a larger diameter than 20 μm are preliminarily perforated through a holder 1122 of alumina ceramics. Then, metal wires 1121 of a metal such as gold or an alloy thereof having a diameter of 20 μm are passed through the holes 1142. After that, a resin 1123 is introduced into between the holder 1122 and the metal wires 1121, and then cured therein. After curing, the metal wires 1121 are cut along dotted lines 1124 so as to form an electrically connecting member 1125.

Figure 28A:
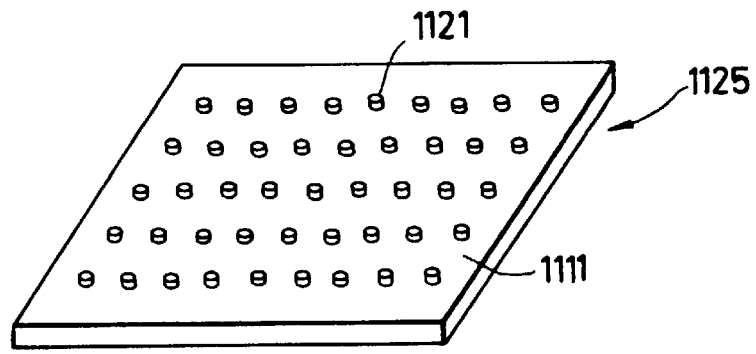
FIGS. 28A, 28B, 29A and 29B show said embodiment.
Figure 28B:
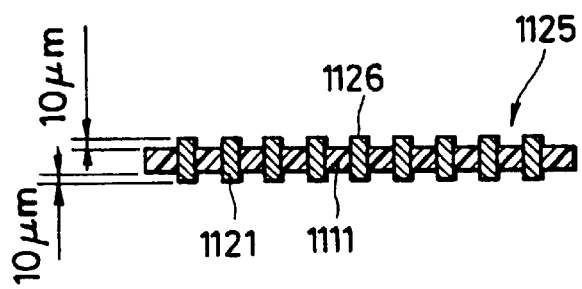
Figure 29A:
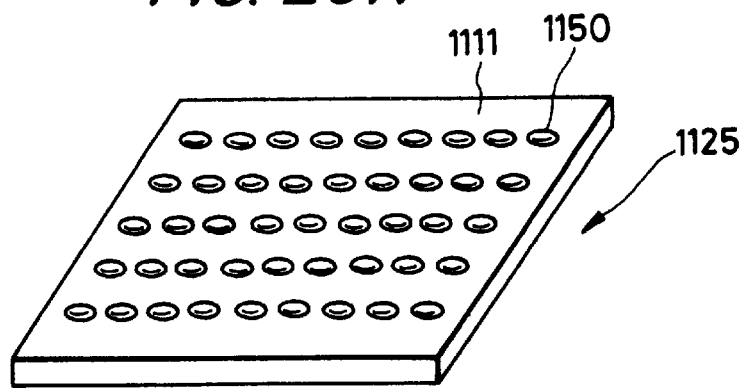
Figure 29B:
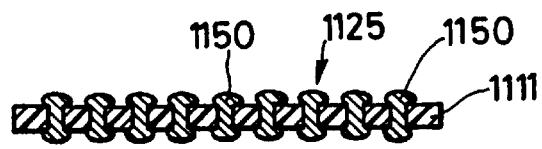

The electric bonding intermediary of the seventh or eighth embodiment may be modified such that it has projections as is the case of the bonding intermediary shown in FIGS. 28A, 28B or such that it has bumps as is the case of the bonding intermediary shown in FIGS. 29A, 29B.

As will be understood from FIGS. 28A and 28B, in the electric bonding intermediary 1125 used in this embodiment, the exposed ends of the metallic members 1107 are slightly projected from the surfaces of the resin insulator 1111.

This type of electric bonding intermediary 1125 can be fabricated by preparing a member of the type shown in FIGS. 26B and 26C described before, and subjecting the surfaces of the member to an etching until the metallic wires 1121 project from the surfaces of the polyimide resin body 1123 by a length of, for example, 10 μm or so.

The fabrication of this type of electric bonding intermediary by etching is only illustrative and other suitable chemical or mechanical methods can be used equally well.

It is possible to form bumps 1150 as shown in FIGS. 29A and 29B, by placing the electric bonding intermediary 1125 between a pair of dies having recesses corresponding to the metallic wires 1121 and then compacting the dies so as to collapse the projecting portions 1126 of the metallic wires 1121. The provision of the bumps 1150 effectively prevent the metallic wires from coming off the insulator 1111.

The bumps may also be formed by heating and melting the projections or other suitable method.

Example of Bonding Between First and Second Electric Circuit Components through Bonding Intermediary According to Invention The bonding between the first and second electric circuit components through the electrical connecting member or electrical bonding intermediary of the invention can broadly be sorted into the following three types A, B and C.

Bonding of Type A

The first and the second electric circuit components are bonded to each other through the electrical connecting member or electrical bonding intermediary. The bonding is effected by any known method, including a mechanical method such as pressing the electric circuit components together while placing the connecting member or bonding intermediary therebetween.

Bonding of Type B

In this type of bonding, the bonding areas of the first electric circuit component are bonded by alloying to the ends of the metallic members exposed in the side of the connecting member or bonding intermediary adjacent to the first electric circuit component or, alternatively, the bonding areas of the second electric circuit component are bonded by alloying to the ends of the metallic members exposed in the side of the connecting member or bonding intermediary adjacent to the second electric circuit component. In this type of bonding, therefore, alloying of the bonding areas is effected on either the first electric circuit component or the second electric circuit component.

The alloying may simply be effected by placing corresponding bonding areas in contact with each other and heating them at a suitable temperature. As a result of the heating, diffusion of atoms and other phenomena take place to form a solid-solution or intermetallic compound layer at the boundary, thus alloying and bonding the bonding areas of the two members. When Au is used as the material of the metallic members and when the bonding area of the electric circuit component is constituted of Al, the alloying heating temperature preferably ranges between 200 and 350° C.

The bonding between the bonding intermediary and the other electric circuit component which is not alloyed may be achieved by any suitable method, e.g., by pressing them together.

According to this type of bonding, superior reliability of connection is achieved without any substantial fluctuation in the resistance value, because one of the electric circuit components is bonded to the connecting member or bonding intermediary through alloying.

In this type of bonding, as explained before, the alloying of the bonding area for the electrical connection is effected on only one of the first and the second circuit components. Therefore, when either the first or the second circuit component involves a risk of degradation due to heat applied during alloying, such electric circuit component is bonded by other means, e.g., by mechanical pressing, while the bonding by alloying is conducted with respect to the other electric circuit component.

The occasion may demand that one of the electric circuit components be freely demountable even after the completion of the electric circuit device. In such a case, the electric circuit component which is to be demountable is connected by a mere pressing, without being alloyed.

Bonding of Type C

In this type of bonding, the bonding areas of the first electric circuit component are bonded by alloying to the ends of the metallic members exposed in the side of the connecting member or bonding intermediary adjacent to the first electric circuit component and, at the same time, the bonding areas of the second electric circuit component are bonded by alloying to the ends of the metallic members exposed in the side of the connecting member or bonding intermediary adjacent to the second electric circuit component. In this type of bonding, therefore, alloying of the bonding areas is effected on both the first electric circuit component and the second electric circuit component. The alloying method may be similar to that used in the type B of bonding.

In this type of bonding, both electric circuit components are rigidly (strongly) bonded together, by virtue of the alloying bonding between the connecting member or bonding intermediary and the bonding areas of both electric circuit components. In consequence, electric circuit devices of superior mechanical strength can be produced with an extremely low rate of rejection.

In addition, since both electric circuit components are bonded through alloying, it is not necessary to employ any jig or the like means for holding the electric circuit component during the production of the electric circuit device, thus facilitating the production, as well as the management of the product device.

Furthermore, the resistance of the electrical connection between both electric circuit components is reduced as compared with the type B of bonding which employs alloying of only one of the electric circuit components, because both the first and the second electric circuit components are bonded through alloying.

Alloying

Alloying as used in the specification is defined as follows.

Where an electrically conductive member and connecting portions of an electric circuit device to be connected are made of the same pure metal, connection therebetween by alloying has the same crystal structure as the conductive member and the connecting portions. An example of the alloying is heating at an appropriate temperature after contacting an edge of the conductive member with a connecting portion corresponding to the edge. The heating causes diffusion of atoms near the contact. The diffusion area becomes an alloy, thus forming the connection.

Where the conductive member and the connecting portions to be connected are made of respective pure metals different from each other, the connection is an alloy of the metals. The alloying process is heating at an appropriate temperature after contacting an edge of the conductive member and the connecting portion corresponding to the edge. The heating causes diffusion of atoms near the contact area, forming a layer of a solid solution or an intermetallic compound. The layer becomes the connection.

Where one of the conductive member and the connecting portion is made of a pure metal and the other is made of an alloy, or where both are made of alloys identical to or different from each other, the connection becomes their alloy.

Regarding a plurality of the conductive members in an electrically connecting member, there are various cases as follows: All of them are made of an identical metal or alloy. They are made of respective, different metals or alloys. Some of them are made of the same metal or alloy and the others are made of different metals or alloys. In any case, the alloying is effected, and a connection is established.

It is essential that the conductive member and the connecting member be an alloy or alloys at their contacting areas. The other areas of the members need not be composed of alloy, e.g., can be a resin impregnated with glass fibers.

It is preferable that the contact areas have a small surface roughness, preferably less than 0.3 $\mu$m, in order to enhance the strength of a connection. Furthermore, a layer of plating of an easily alloyed metal or an alloy may be present on a surface to be connected.

Seal

In the present invention, the electric circuit parts may be sealed by a sealing material.

The sealing may be effected on one or a plurality of the electric circuit parts.

Materials for the sealing

In the present invention a thermoplastic resin may be used as a sealing material. The thermoplastic material can be selected from the following: polyimide, polyphenylene sulfide, polyether sulfone, polyether imide, polysulfone, fluororesin, polycarbonate, polydiphenylether, polybenzylimidazole, polyamidimide, polypropylene, polyvinyl chloride, polystyrene, methyl methacrylate, other resins.

The sealing may be one of the above resins or dispersed within the resin may be either or both of powders and fibers of one or more metals, alloys and inorganic materials. The dispersion may be performed by adding the powders or fibers to the resin and agitating them. However, the dispersion may also be done by any other method.

The metals or the alloys may be selected from Ag, Cu, Au, Al, Be, Ca, Mg, Mo, Fe, Ni, Si, Co, Mn, W, etc.

The inorganic materials may be selected from ceramics: $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, $P_2O_5$, $TiO_2$, MgO, SiC, BeO, BP, BN, AlN, $B_4C$, TaC, $TiB_2$, $CrB_2$, TiN, $Si_3N_4$, $Ta_2O_5$, etc.; diamond; glass; carbon; boron; and other inorganic materials.

A size, a shape, a dispersion position, and an amount of dispersed powders and fibers may be chosen within a range where metal members embedded in insulator are without contact or short-circuit with each other through the powders or the fibers. It is, however, preferable that the size of the powders and the fibers is smaller than a distance between two neighboring metal members. That is, the electrically conductive members should not preferably contact each other even through the powders and the fibers. The powders and the fibers may or may not be exposed outside the insulator. The powders and the fibers may or may not contact each other.

If either or both of the powders and the fibers of one or more of the metals, the alloys and the ceramics are dispersed in the sealing, the electric circuit device has a superior heat dissipation because heat generated in the electric circuit parts is transmitted earlier to the outside. Further, the electric circuit device has a high shielding property.

Sealing process

The sealing process is i) setting in a molding cavity the electric circuit member which comprises an electrical connecting member and electric circuit members connected to the connected member, ii) injecting a sealing material into the cavity by injection molding to seal them. The electric circuit member may be sealed by such injection molding, extrusion molding, cast molding, blow molding or any other method.

Plate

In the present invention, a plate may be stuck to at least one of the surfaces of the sealings.

The plate may also be stuck to another face of the electric circuit part opposite the electrical connecting member. It is unnecessary that the plate be stuck to all the electric circuit parts. It is sufficient that a plate is stuck to at least a portion of at least one electric circuit member.

Furthermore, at least one plate or a plate assembly may be placed near a face of the circuit part opposite the connecting member or a side face thereof. Such plate is not always placed near all the electric circuit parts. It is essential that a plate is placed near at least one electric circuit part.

The plate may be made of any material different from that of the sealing.

The plate has a thickness, e.g., preferably of 0.05 to 0.5 mm in case of a stainless steel plate.

There is no limitation for the sticking of the plate. For example, the plate may be stuck by an adhesive. Any other method can be employed if the plate may hold the electric circuit device.

The thus disposed plate may prevent stress concentration and the resulting cracks due to an internal stress or an external stress. The plate lengthens a pass from the outside to the electric circuit parts, thus making it difficult for foreign materials such as water to reach the electric circuit parts. This enhances reliability of the device.

If the plate is made of a metal such as stainless steel, ceramics, carbon or diamond with high heat conductivity, heat generated by the electric circuit parts may be dissipated fast to the outside, thus resulting in an electric circuit device superior in heat dissipation property. Further, if the plate is made of a metal, noises from the outside and electromagnetic noises generated from the electric circuit parts may effectively be shielded, providing an electric circuit device superior in shielding property.

Cap

The electric circuit device of the present invention may have a cap for cap-sealing the electric circuit parts.

The "cap-sealing" means covering and sealing the electric circuit parts to provide an internal hollowed space.

The cap may be provided for one or plural electric circuit parts.

In the cap-sealing, the sealing should preferably be effected such that the electric circuit parts are held tight on the electrical connecting member. For example, an inside face of the cap is shaped corresponding to an outer surface of the electric circuit parts and is made contacting the outer surface of the circuit part to effect the cap-sealing.

The cap may be stuck to an electric circuit part or another cap which is provided for another electric circuit part to be cap-sealed if any by an adhering method with an adhesive, a mechanical method, a fusion, and any other method.

Materials for the cap

The cap may be made of any of metals, inorganics or organics.

The metals may be, for example, ceramics such as $SiO_2$, $B_2O_3$, $Al_2O_3$, $Na_2O$, $K_2O$, $CaO$, $ZnO$, $BaO$, $PbO$, $Sb_2O_3$, $As_2O_3$, $La_2O_3$, $ZrO_2$, $P_2O_5$, $TiO_2$, $MgO$, $SiC$, $BeO$, $BP$, $BN$, $AlN$, $B_4C$, $TaC$, $TiB_2$, $CrB_2$, $TiN$, $Si_3N_4$, $Ta_2O_5$; diamond; glass; carbon; boron; others.

In the inorganic materials, a metal material, a resin or other material may be dispersed.

The organic materials may be any of thermosetting resins, ultraviolet curable resins, and thermoplastic resins.

Further, either or both of powders and fibers of metals and inorganics may be dispersed in the resins. If dispersed, a shape, a size, a dispersion position and an amount of the dispersed powders and the fibers are not limited. Also, at least one of plates, rods and balls of either or both of metals and/or inorganics may be embedded within the resins. A location of the embedding, a shape, a size and an amount of the embedded plates rods and/or balls are not limited. The powders, the fibers, the plates, the rods and the balls may contact each other in the resins.

Adjusting member

In the present invention, an adjusting member may be disposed between the cap and the electric circuit part.

The adjusting member may be made of any of metals, inorganics and organics, which are preferably elastic.

A shape of the adjusting member is not limited to a specific one if it can adjust a height of the electric circuit part.

The intervention of the adjusting member between the electric circuit part and the cap allows adjustment of the height of the electric circuit part, resulting in avoiding preparation of various inside shapes of the cap fitting the electric circuit part. Also, deviation of dimensions upon assembling may be adjusted by the adjusting member. Such an adjusting member is especially effective to the cap-sealing of various electric circuit devices.

According to the present invention, since the above-explained electrically connecting member connects between the first and the second electric circuit parts, the connecting portions of the electric circuit parts may be located at an inside area thereof and the number of the connection portions may be increased, thus enabling high concentration of the connections.

The electrically connecting member may be made thinner, thus enabling reduction of thickness of the electric circuit member.

In addition, since an amount of the metal members used for the electrically connecting member is small, the total cost will be low even if expensive gold is used as the metal member.

The present invention as described has numerous advantages as follows:

1. Highly reliable connection may be obtained between a semiconductor element and a circuit element such as a circuit plate and a lead frame. The connection of the present invention may be used instead of a wire bonding method, a TAB method and a CCB method.
2. Since the connecting portion of the electric circuit parts may be located at any position, especially inside areas, multiple connections more than the wire bonding method and the TAB method are allowed to suit for a multi-pin connection.

Further, since there is an insulating material between neighboring metals of the electrically connecting member, electric conduction is prohibited between the neighboring metals, which results in allowing more connections than those by the CCB method.

3. Since a very small amount of metal members is used in the electrically connecting member as compared with the conventional methods, the total cost is cheaper even if expensive metal such as gold is used for the metal members.
4. The present invention provides a highly concentrated semiconductor device and the like.

Moreover, since the electrically conductive members of the electrically connecting member are embedded in the holder, they are not affected by a sealing pressure, a sealing speed and other upon injection of the sealing material. For this, any sealing process is available in the present invention. Accordingly, the sealing can be effected not only by thermosetting resins for a constant pressure transfer, but also by thermoplastic resins which cannot have been used because of extremely high pressure injection.

In addition, according to the electric circuit device of the present invention with the cap-sealing, even when heat is generated in the electric circuit parts, the hat is dissipated to the outside through the electrically connecting member and the cap. Thus, the present invention provides an electric circuit device superior in heat dissipation.

Further, a space between the cap and the electric circuit part may effectively prevent reliability problems such as deterioration of property of the electric circuit part and cracks of the cap caused by thermal stress due to a heat expansion coefficient difference in case that the electric circuit part is embedded in the sealing. The space is specifically effective when the difference of heat expansion coefficient is significant between the electric circuit par and the sealing.

If the cap is made of a metal such as iron or an iron alloy, noises from the outside and electromagnetic noises generated from the electric circuit parts may be effectively prevented, providing an electric circuit device superior in property.

What is claimed is:

1. An electrical connecting member for use in an electrical connection for connecting a first electrical circuit component on a side thereof and a second electrical circuit component on another side thereof, said electrical connecting member comprising:

a plurality of layers each layer having a plurality of conductive members and an insulative holder for holding said plurality of conductive members, wherein said plurality of conductive members are arranged such that each conductive member has one end exposed on one surface of said layer and another end exposed on another surface of said layer, and makes electric contact with at least one of a conductive member immediately below and a conductive member immediately above, but does not contact conductive members laterally offset thereof, and wherein said conductive members have diameters that are substantially equal to each other, between said one surface of said layer and said another surface of said layer; and said plurality of layers are stacked such that said plurality of conductive members in one layer are connected with said plurality of conductive members in another layer, and are held by said insulative holder with a different pitch shifted slightly from said plurality of conductive members in another layer.

2. An electrical connecting member according to claim 1, wherein said insulative member comprises an organic material.

3. An electrical connecting member according to claim 2, wherein said organic insulative material of said insulative member comprises a resin.

4. An electrical connecting member according to claim 3, wherein said resin is at least one resin selected from the group consisting of thermosetting resins, thermoplastic resins and ultraviolet curing resins.

5. An electrical connecting member according to claim 3, wherein said resin comprises at least one resin selected from the resin group consisting of polyamide, polyphenylenesulfide, polyethersulfone, polyetherimide, polysulfone, silicone resin, fluorine plastics, polycarbonate, polydiphenylether, polybenzylimidazole, phenol, ureas, melamine, alkyd resin, epoxy resin, polyamide-imide resin, polypropylene, polyvinyl chloride, polystyrene, methacrylate methyl, polyphenylene oxide, methacrylic resins, and vinylidene chloride.

6. An electrical connecting member according to any one of the claims 1–4, wherein said conductive members comprise at least one metal selected from the group consisting of Au, Ag, Be, Ca, Mg, Mo, Ni, W, Fe, Ti, In, Ta and Zn.

7. An electrical connecting member according to claim 1, wherein said exposed end of each of said plurality of conductive members has a bump-shape.

8. An electrical member having a first electrical circuit component, a second electrical circuit component and an electrical connecting member for connecting said first electrical circuit component on one side thereof and said second electrical circuit component on another side thereof, said electrical connecting member comprising:

a plurality of layers each layer having a plurality of conductive members and an insulative holder for holding said plurality of conductive members, wherein said plurality of conductive members are arranged such that each conductive member: (i) has one end exposed on one surface of said layer and another end exposed on another surface of said layer, (ii) makes electric contact with at least one of a conductive member immediately below and a conductive member immediately above, but does not contact conductive members laterally offset thereof, (iii) has a diameter that is substantially equal to the diameter of other conductive members, between said one surface of said layer and said another surface of said layer; and said plurality of layers stacked such that said plurality of conductive members in one layer are connected with said plurality of conductive members in another layer, and held by said insulative holder with a different pitch shifted slightly from said plurality of conductive members in another layer.

9. An electrical circuit device having a first electrical circuit component, a second electrical circuit component, an electrical connecting member for connecting said first electrical circuit component on one side thereof and said second electrical circuit component on another side thereof and a sealing member for sealing at least said first electrical circuit component and said second electrical circuit component, said electrical connecting member comprising:

a plurality of layers each layer having a plurality of conductive members and an insulative holder for holding said plurality of conductive members, wherein said plurality of conductive members are arranged such that each conductive member has one end exposed on one surface of said layer and another end exposed on another surface of said layer, makes electric contact with at least one of a conductive member immediately below and a conductive member immediately above, but does not contact conductive members laterally offset thereof, and has a diameter that is substantially equal to the diameter of other conductive members, between said one surface of said layer and said another surface of said layer; and said plurality of layers stacked such that said plurality of conductive members in one layer are connected with said plurality of conductive members in another layer, and held by said insulative holder with a different pitch shifted slightly from said plurality of conductive members in another layer.

* * * * *

UNITED STATES PATENT AND TRADEMARK OFFICE
CERTIFICATE OF CORRECTION

PATENT NO.    : 5,967,804
DATED         : October 19, 1999
INVENTOR(S)   : Tetsuo Yoshizawa et al.

It is certified that error appears in the above-identified patent and that said Letters Patent is hereby corrected as shown below:

Title page, Item [54] and Column 1, line 1,
"CIRCUIT MEMBER" should read -- CONNECTING MEMBER --.
Line 6, "abandoned" should read -- abandoned, --;
Line 50, "Referring-to" should read -- Referring to --.

Column 3,
Line 17, "A" should read -- A$\ell$ --;
Line 19, "impaired." should read -- impaired. --; and
Line 64, "(c)" should read -- (b) --.

Column 4,
Line 1, "(d)" should read -- (c) --.

Column 7,
Line 37, "oneof" should read -- one of --.

Figure 12B:
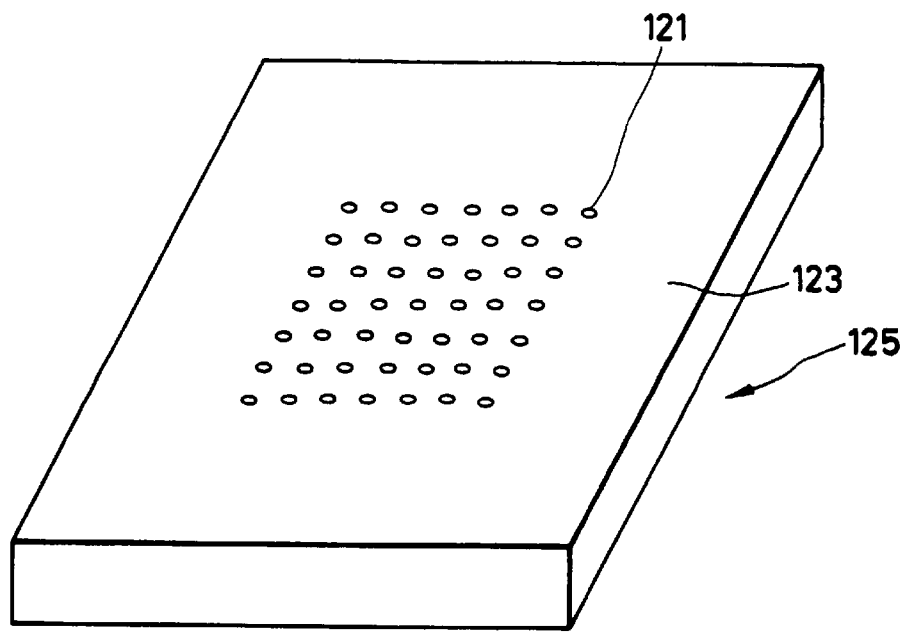
Figure 12C:
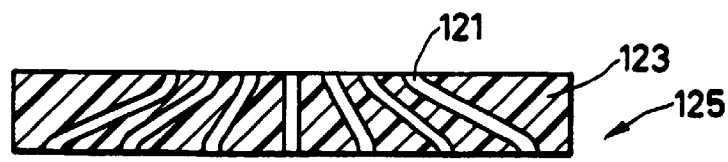

Column 13,
Line 8, "b c and" should read -- b, c, and --; and
Line 39, FIGS. 20B and 20C" should read -- FIGS. 12B and 12C --.

Column 14,
Line 59, "b c and" should read -- b, c, and --.

Column 16,
Line 4, "FIG. 31A," should read -- FIG. 21A, --;
Line 24, "1212" should read -- 121 --;
Line 28, "although," should read -- although --; and
Line 49, "wires 1212" should read -- wires 121 --.

Column 17,
Line 4, "b c and" should read -- b, c, and --.

Column 18,
Line 24, "1107," should be deleted;
Line 25, "1111." should be deleted; and
Line 32, "1108, 1109" should be deleted.

Column 19,
Line 32, "1107" should be deleted.

UNITED STATES PATENT AND TRADEMARK OFFICE
CERTIFICATE OF CORRECTION

PATENT NO. : 5,967,804
DATED : October 19, 1999
INVENTOR(S) : Tetsuo Yoshizawa et al.

It is certified that error appears in the above-identified patent and that said Letters Patent is hereby corrected as shown below:

Column 21,
Line 66, "methacrylate," should read -- methacrylate, and --.

Column 23,
Line 46, "plates rods" should read -- plates, rods --.

Column 24,
Line 47, "hat" should read -- heat --; and
Line 58, "par" should read -- part --.

Signed and Sealed this

Eighteenth Day of June, 2002

*Attest:*

JAMES E. ROGAN
*Director of the United States Patent and Trademark Office*

*Attesting Officer*